United States Patent [19]

Hsieh et al.

[11] Patent Number: 5,558,904
[45] Date of Patent: Sep. 24, 1996

[54] ELECTROLUMINESCENT DEVICES CONTAINING A CONJUGATED POLYMER OBTAINED VIA HALOGEN PRECURSOR ROUTE CHEMISTRY

[75] Inventors: Bing R. Hsieh; Gordon E. Johnson, both of Webster; Homer Antoniadis, Rochester; Kathleen M. McGrane, Webster; Milan Stolka, Fairport, all of N.Y.

[73] Assignee: Xerox Corporation, Stamford, Conn.

[21] Appl. No.: 272,172

[22] Filed: Jul. 8, 1994

[51] Int. Cl.$^6$ .................................................. D05D 5/12
[52] U.S. Cl. .......................... 427/66; 427/294; 427/295; 427/296; 427/389.7; 427/393.5; 427/404; 427/407.1; 427/407.2; 427/412.1
[58] Field of Search .................................. 427/66, 389.7, 427/407.1, 407.2, 404, 294, 295, 296, 412.1, 393.5

[56] References Cited

U.S. PATENT DOCUMENTS

| | | | |
|---|---|---|---|
| H183 | 1/1987 | Karasz et al. | 427/395.5 |
| 3,621,321 | 11/1971 | Williams et al. | 313/108 A |
| 4,356,429 | 10/1982 | Tang | 313/503 |
| 4,528,118 | 7/1985 | Murase et al. | 252/500 |
| 4,672,265 | 6/1987 | Eguchi et al. | 313/504 |
| 4,769,292 | 9/1988 | Tang et al. | 428/690 |
| 4,907,043 | 3/1990 | Uekita et al. | 427/66 |
| 4,933,106 | 6/1990 | Sakai et al. | 252/500 |
| 4,950,950 | 8/1990 | Perry et al. | 313/504 |
| 5,073,446 | 12/1991 | Scozzafava et al. | 428/323 |
| 5,276,381 | 1/1994 | Wakimoto et al. | 313/504 |

FOREIGN PATENT DOCUMENTS

| | | |
|---|---|---|
| 0294061A1 | 12/1988 | European Pat. Off. |
| WO90/13148 | 11/1990 | WIPO |

OTHER PUBLICATIONS

Burroughes J., et al., "Light-emitting Diodes Based on Conjugated Polymers", *Nature,* 347:539–541 (1990) (Oct.).
Braun, D., et al., "Visible Light Emission From Semiconducting Polymer Diodes", *Appl. Phys. Lett.,* 58(18):1982–1984 (1991) no mo.
Antoniadis, H., et al., "Photovoltaic and Photoconductive Properties of Aluminum/Poly(p–phenylene vinylene) Interfaces", *Synthetic Metals,* (62):265–271 (1994).
Marks, R., et al., "The Photovoltaic Response in poly(p–phenylene vinylene) Thin–film Devices", *J. Phys. Condens. Matter,* (6):1379–1394 (1994). (no mo.).
Antoniadis, H., et al., "Charge Transfer from poly(p–phenylene vinylene) Into Molecularly Doped Polymer", *Appl. Phys. Lett.,* 62(24):3167–3169 (1993). (Jun.).
Fuchigami, H., et al., "Polythienylenevinylene Thin–Film Transistor With High Carrier Mobility", *Appl. Phys. Lett.,* 63(10):1372–1374 (1993). (Sep.).

Yu, G., et al., "Semiconducting Polymer Diodes: Large Size, Low Cost Photodetectors With Excellent Visible–Ultraviolet Sensitivity", *Appl. Phys. Lett.,* 64(25):3422–3424 (1994) (Jun.).
Yu, G., et al., "Dual–Function Semiconducting Polymer Devices: Light–emitting and Photodetecting Diodes", *Appl. Phys. Lett.,* 64(12):1540–1542 (1994) (Mar.).
Gilch, H., et al., "Polymerization of α–Halogenated p–Xylenes With Base" *Journal of Polymer Science: Part A–1,* 4:1337–1349 (1966). (no mo.).
Swatos, W., et al., "Polymerization of 2,5-Di-n-hexyloxy-α,α$^1$-dichloro-p-xylene With Potassium tert-Butoxide: a Novel Route to Poly(2, 5-di-n-hexyloxy-p-phenylene vinylene)", *Polymer Preprints,* 30(1):505–506 (1990). (no mo.).
Hsieh, B., et al., "A Dehydrochlorination (DHCL) Route to Poly(2,3-diphenyl-1,4-phenylene vinylene) (DP–PPV)", *Polymer Preprints,* 34(2):410–411 (1993) (no mo.).
Burn, P., et al., "Chemical Tuning of the Electronic Properties of Poly (p–phenylenevinylene)–Based Copolymers", *J. Am. Chem. Soc.,* (115):10117–10124 (1993) (Nov.).
Kojima, K., et al., "Electroluminescence in Polyethylene Terephthalate (PET) I. Impulse Voltage", *Japanese Journal of Applied Physics,* 21(6):860–864 (1982) (Jun.).
Vincett, P., et al., "Electrical Conduction and Low Voltage Blue Electroluminescence in Vacuum–Deposited Organic Films", *Thin Solid Films,* 94:171–183 (1982) (no mo.).
Partridge, R. H., "Electroluminescence from Polyvinylcarbazole Films: 4. Electroluminescence Using Higher Work Functions Cathodes", *Polymer,* 24:755–762 (1983) (Jun.).
Brown, A., et al., "Poly(p–phenylenevinylene) Light-emitting Diodes: Enhanced Electroluminescent Efficiency Through Charge Carrier Confinement", *Applied Physics Letters,* 61(23):2793–2795 (1992) (Dec.).
Kido, J., et al., "Poly(methylphenylsilane) Film as a Hole Transport Layer in Electroluminescent Device", *Applied Physics Letters,* 59(21):2760–2762 (1991) (Nov.).
Paulvannan, K. et al., "Phenylated Poly(Phenylene Vinylene)", *Polymer Preprints,* 32(1):192–193 (1991) (no mo.).
Friend, R., "Optical Investigations of Conjugated Polymers", *J. of Molecular Electronics,* 4:37–46 (1988) (no mo.).
Ballard, D., et al., "A Biotech Route to Polyphenylene" *J. Chem. Soc. Chem. Commun.* 954–955 (1983) (no mo.).

*Primary Examiner*—Janyce Bell
*Attorney, Agent, or Firm*—Oliff & Berridge; Eugene O. Palazzo, Esq.

[57] ABSTRACT

An electroluminescent device includes a light emitting layer made of a conjugated polymer that is prepared using halogen precursor route chemistry.

14 Claims, 4 Drawing Sheets

ELECTROLUMINESCENT DEVICES CONTAINING A CONJUGATED POLYMER OBTAINED VIA HALOGEN PRECURSOR ROUTE CHEMISTRY

BACKGROUND OF THE INVENTION

The present invention relates to thin film electroluminescent ("EL") devices, and in particular to a method for making EL devices that contain at least one organic light-emitting layer comprising a conjugated polymer prepared by halogen precursor route chemistry. EL devices are structures that emit light when subjected to an applied electric field. EL devices have been conventionally used for a variety of purposes, such as for shaped elements known as light emitting diodes that operate as indicators on vehicle dashboards, cookers, video recorders and the like.

There have been known two layer EL devices comprising two organic layers, wherein the first organic layer comprises an organic light emitting compound and a second organic layer comprises an organic hole transport compound, both layers being layered on each other and arranged between a metal electrode (e.g., cathode) and a transparent electrode (e.g., anode). There have also been known three layer EL devices, in which an organic electron transport layer, an organic fluorescent layer and an organic hole transport layer are layered on each other and arranged between a metal electrode (e.g., cathode) and a transparent electrode (e.g., anode). In such three layer EL devices, the organic hole transport layer has the functions of transporting holes injected from the anode and blocking electrons, while the organic electron transport layer has a function of transporting electrons injected from a cathode. The light emitting layer can further include a fluorescent material capable of emitting light in response to hole and electron recombination. Such two and three layer structures are typically manufactured by applying the organic layers by well known solvent coating techniques for polymeric materials or by vacuum deposition for molecular systems.

U.S. Pat. No. 5,276,381 to Wakimoto discloses an organic EL device that includes an organic light emitting layer comprising a quinoline derivative and a quinacridone or quinazoline compound. U.S. Pat. No. 4,769,292 to Tang teaches a method for applying EL layers that includes applying a luminescent layer to a substrate by vacuum deposition. U.S. Pat. No. 4,950,950 to Perry discloses a multilayer EL device comprising silane hole transporting agents. U.S. Pat. No. 4,356,429 to Tang illustrates organic EL cells having a hole injecting porphyrinic zone. Vincett, P. S., et al., *Thin Solid Films,* 94:171 (1982); R. H. Partridge, *Polymer,* 24:755 (1983); Burroughes, J. H., et al., *Nature,* 347:539 (1990); Braun, D., et al., *Applied Physics Letters,* 58:1982 (1991); Braun, D., et al., *J. Electronic Materials,* 20:945 (1991); Brown, A. R., et al., *Applied Physics Letters,* 61:2793 (1992); and Kido, J., et al., *Applied Physics Letters,* 59:2760 (1991) each disclose other organic EL compositions. Recently, thin film devices such as photodetectors (Yu, G., et al., *Applied Physics Letters,* 64:1540–1542 (1994) and *Applied Physics Letters,* 64:3422–3424 (1994)), photovoltaic cells (Antoniadis, H., et al., *Synthetic Metals,* 62:265–271 (1994) and Marks, R. N. *Journal of Physics: Condensed Matter,* 6:1379–1394 (1994)), field effect transistors (Fuchigami, H., et al, *Applied Physics Letters,* 63:1372–1374), and photogeneration layers in photoreceptors (Antoniadis, H., et al., *Applied Physics Letters,* 62:3167–3169 (1993)) based on PPV and related polymers, have also been reported.

There have also been known EL devices wherein the light emitting layer comprises a conjugated polymer. There are two important approaches to the preparation of conjugated polymer thin films, namely the precursor approach and side chain approach. The former relies on the preparation of a soluble precursor polymer that can be cast into thin films. For instance, WO 90/13148 to Friend discloses an EL device comprising a semiconductive light emitting layer made of a conjugated polymer known as poly(p-phenylene vinylene) ("PPV"). The disclosed PPV is prepared via sulphonium precursor route chemistry using sulphonium precursors that are soluble in water and methanol.

The disclosed soluble sulphonium precursor is deposited on electroded substrates such as indium tin oxide (ITO) coated glass and subsequently thermally converted to form PPV that emits light in response to an applied electric field. In particular, a sulphonium salt precursor is transformed to a final conjugated polymer film through solid state thermo- or photo-conversion.

The sulphonium precursor route involves the polymerization of p-xylene-bis-(tetrahydrothiopheniumchloride), or one of its analogs or derivatives, in the presence of a base in water or methanol to give the corresponding sulphonium precursor polymer. After purification, the sulphonium precursor polymer solution is used to cast films that are then thermally converted to give PPV thin films. Due to the solubility of sulphonium precursors, the sulphonium precursor route is useful for the preparation of PPV. The use of sulphonium precursors to obtain many other electroluminescent substituted PPV derivatives, however, is disadvantageous for several reasons. For instance, the sulphonium salt precursor route: uses precursor polymers that have an offensive odor; is limited by the number of workable sulphonium salt precursors that can be readily synthesized; produces precursor polymers that are highly unstable; produces polymer precursors that have limited storability properties because they precipitate out of solution as a gel within two weeks when stored in polar solvents, such as methanol; releases environmentally unsafe sulfides and hydrogen halides during thermoconversion; and requires exhaustive and tedious purification steps via dialysis, which in turn lead to low yields of the desired PPV (usually 20%–40% retention). Moreover, depending on the particular sulphonium salt precursor monomer used, polymerization conditions must be modified or adjusted by trial and error to obtain substituted derivatives of PPV that can be used to produce reliable EL devices.

The side chain approach involves the polymerization of a highly substituted monomer to a soluble conjugated polymer that can be cast into thin films directly without conversion. The polymerization of bis(halomethyl)benzenes in the presence of large excess base to poly(arylene vinylenes) is conventionally known as the Gilch synthesis route. See Gilch, et al., *Journal of Polymer Science: Part A-1,* 4:1337 (1966). In principle, the adaptation of the Gilch route to the polymerization of a bis(halomethyl)benzene with side groups or solubilizing groups should give a soluble poly(arylene vinylene). Unfortunately, this is not the case in practice because of polymer product precipitation during polymerization. Such precipitation is caused by the high molecular weight and/or semicrystallinity of the product. As a result, soluble product is obtained in low molecular weights and very low yields (e.g., 0–10%).

The use of halogen precursors for the production of PPV and substitutes thereof was first reported by Swatos, W. J. et al., *Polymer Preprints,* 30(1):505–506 (1990) for the preparation of poly(2,5-dihexyloxy-1,4-phenylene vinylene) and then by Hsieh, B., et al., "A Dehydrochlorination (DHCL) Route to Poly(2,3-diphenyl-1,4-phenylene vinylene) (DP-PPV)," *Polymer Preprints*, 34(2):410–411 (1993). However, the use of substituted PPV derivatives obtained using halogen precursor polymers in EL devices has not been heretofore known or suggested. Such substituted PPV derivatives have not been shown to possess electroluminescent properties as thin films.

SUMMARY OF THE INVENTION

The present invention is based upon the discovery that PPV based EL devices, especially substituted derivatives of PPV-based EL devices, are easily obtained by using the halogen precursor synthesis route rather than the abovementioned sulphonium precursor or Gilch routes, such that the above mentioned drawbacks are obviated or at least mitigated.

The present invention is related to the fabrication of thin film EL devices of poly(arylene vinylenes) and poly(arylene acetylenes) via another precursor route, namely the halogen precursor route, which is a modification of the Gilch route. Only about 1.0–1.5 equivalents of base is used, instead of an excess of base, as in the Gilch route, to give a soluble halogen precursor polymer that can be cast into thin films and then converted to a poly(arylene vinylene). The use of halogen precursor route to prepare halogen precursor polymers for thin film EL device fabrication is an unexpected outcome from trying to overcome the many limitations associated with sulphonium precursor route and Gilch dehydrochlorination route. As will be seen from the comparative examples below, the halogen precursor route is a more simple, general and versatile approach than the sulphonium precursor route and the Gilch route for the fabrication of thin film EL devices based on the derivatives of poly(arylene vinylene) or poly(arylene acetylene).

In particular, the present invention provides EL devices containing a light emitting layer comprising a conjugated polymer that has been obtained via the halogen precursor route. Such conjugated polymers include poly(arylene vinylenes) and poly(arylene acetylenes). The present invention also relates to methods of making such EL devices. EL devices of the present invention can be used in situations where electroluminescence is required; where semiconductor light emitting diodes have traditionally been used; and in applications where liquid crystals have been used.

By using the halogen precursor route, no offensive odor is present; an unlimited number of monomers can be easily polymerized under a similar condition to obtain conjugated polymers that are chemically tunable to exhibit desired properties; purification requires only a simple precipitation step instead of exhaustive and tedious dialysis thereby leading to higher yields (ranging from 40–80% retention); and no environmentally unsafe sulfides are released during thermal conversion of halogen precursor polymers.

Moreover, halogen precursor polymers, especially chlorinated precursor polymers, derived from hydrocarbon monomers are very stable in the solid form as well as in organic solvents. A shelf life of more than one year under ambient conditions has been observed for chlorine precursor polymers in powder form as well as in chloroform, tetrahydrofuran, benzene or toluene solvents. On the other hand, halogen precursor polymers derived from heterocyclic monomers, such as thiophene type monomers, are less stable and convert gradually to the corresponding conjugated polymers at room temperature. These polymers can be kept stable in a freezer (−25° C.). A thiophene based chlorine precursor polymer could be converted rapidly in the presence of an organic solvent vapor to the corresponding poly(thienylenevinylene) at room temperature. This room temperature conversion process is more convenient than thermoconversion and is another unexpected advantage of the present invention.

The present inventors have found that EL devices of the present invention, which comprise a conjugated polymer or copolymer, each having been prepared by the halogen precursor route, emit bright visible light that is measurably brighter and more electrically efficient than previously known light emitting conjugated polymers prepared via the sulphonium precursor or Gilch routes.

DETAILED DESCRIPTION OF PREFERRED EMBODIMENTS

Figure 1:
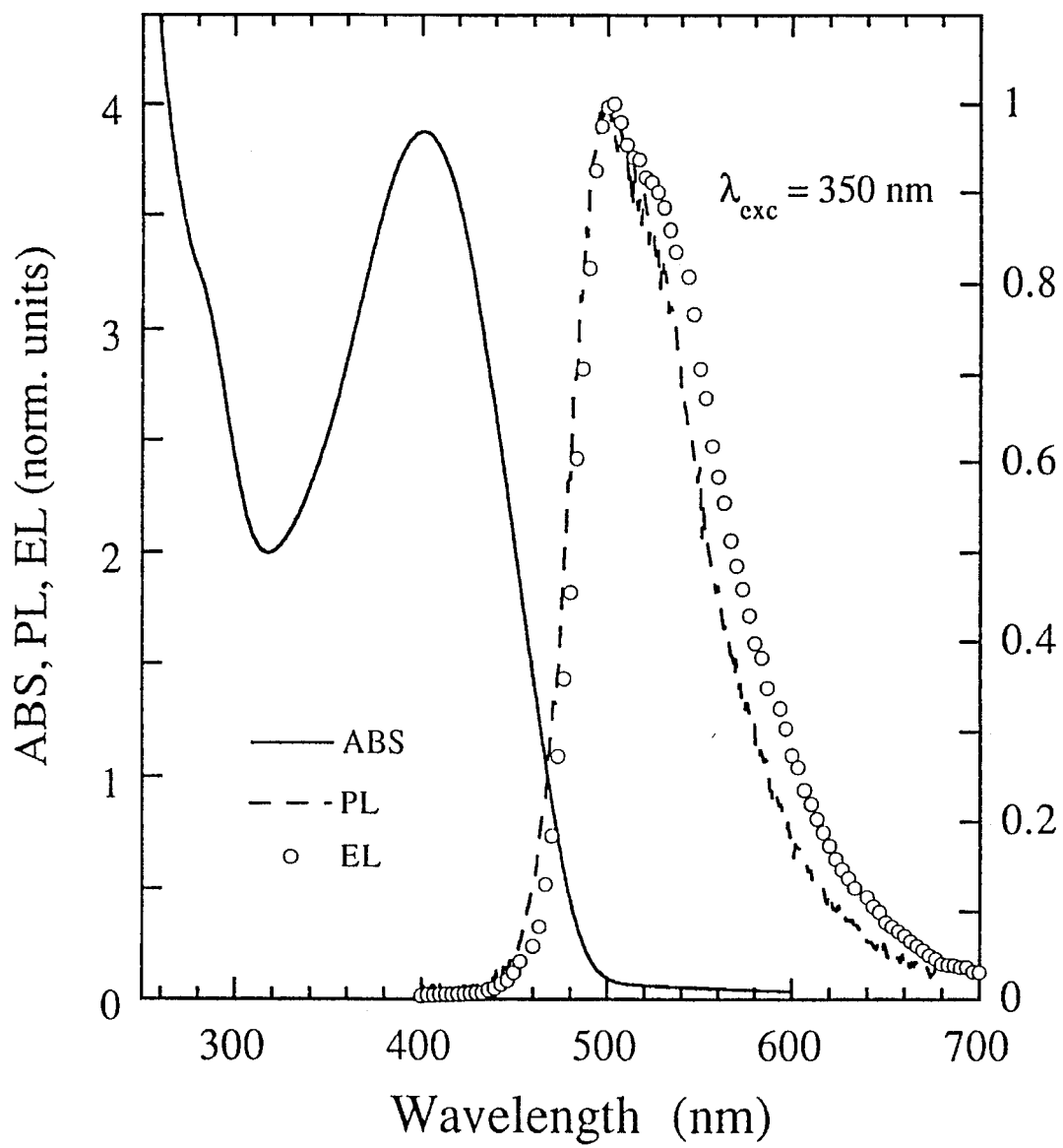
FIG. 1 shows wavelength dependence of absorption (ABS), photoluminescence (PL) and electroluminescence (EL) of DP-PPV. PL corresponds to excitation wavelength of 350 nm and EL to 5 Volts across a ITO/DP-PPV/Mg device (DP-PPV is 500Å).

In accordance with the present invention, EL devices including single, two or three layer EL devices have a light emitting layer prepared using a halogen precursor polymers that is deposited onto a substrate and subsequently converted to the corresponding conjugated polymer. The present invention also provides a method for making an EL device comprising a conjugated polymer obtained via halogen precursor route chemistry, comprising the steps of:

a) polymerizing at least one 1,4-bis(halomethyl)benzene monomer in a first solvent by adding 1.0–1.5 equivalents of a base at −78° to +30° C. under an inert atmosphere;

b) stirring the reaction mixture for 1–24 hours at room temperature upon completion of base addition;

c) pouring the reaction mixture into a non-solvent, such as methanol, acetone, hexane or the like to precipitate the resulting polymer;

d) collecting and drying the polymer in air or under vacuum to give a halogen precursor polymer;

e) preparing a dilute solution of the polymer by dissolving it in a second solvent;

f) depositing a film of the dissolved halogen precursor polymer onto a conductive or supportive substrate;

g) converting the halogen precursor polymer to a poly(arylene vinylene) film;

h) optionally depositing an electron transport layer on said film;

i) depositing cathodes on to the polymer film or electron transport layer to give an EL device comprising a poly(arylene vinylene) conjugated polymer.

The general formula for 1,4-bis(halomethyl)benzene monomer is shown below:

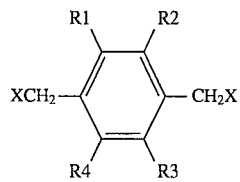

wherein X is halogen and R1, R2, R3 and R4 can be present in any combination, each selected from the group consisting of: hydrogen; methyl; ethyl; n-butyl; n-hexyl; t-butyl; n-octyl; methoxy; butoxy; hexyloxy; octoxy; phenoxy; phenyl; 4-biphenyl; terphenyl; 4-fluorophenyl; 4-cyanophenyl; 4-methoxyphenyl; naphthyl; styryl; trimethylsilyl; trifluoromethyl; fluoro; cyano; benzoyl; N,N-diphenylamino; phenylazo; acetoxy; phenylethynyl; benzoylamino; N-benzoylamino; anilido; 4-phenylazo; 2-pyridylazo; benzothiazol-2-yl; benzoxazol-2-yl; 5-phenyl-1,3,4-thiadiazol-2-yl; 5-t-butyl-1,3,4-thiadiazol-2-yl; 5-phenyl-1,3,4-oxadiazol-2-yl; 5-t-butyl-1,3,4-oxadiazol-2-yl; 4-methyl-5-phenyloxazol-2-yl; 1-phenylbenzimidazol-2-yl; 4,5-diphenyltriazol-3-yl; pyrid-2-yl; quinol-2-yl; quinoxal-2-yl; 5-phenyl-2-thienyl; thianaphth-2-yl; maleimido; maleimidophenyl; phthalimido; phthalimidophenyl; 3, 5-diphenylphen-1-yl; 2,3, 4,5-tetraphenylphen-1-yl; 2,3, 4,5,6-pentaphenylphen-1-yl; carbazolyl, 4-(N-carbazolyl)phenyl and ferrocenyl.

Preferably the light emitting layer is of substantially uniform thickness in the range 10 nm to 5 um, preferably 20–200 nm.

The surface composition of thin films of a PPV derivative prepared via halogen precursor route is likely to be different from that of sulphonium derived thin films. Surface compositions can be determined by X-ray photoemission spectroscopy. Halogen and oxygen are the likely surface impurities for the halogen derived PPV thin films; while sulfur impurities, in addition to halogen and oxygen, are likely to be detectable for the the sulphonium PPV thin films. The conductivity of sulfonium derived PPV (about $10^{-8}$ S/cm) is higher than that for a halogen derived PPV ($10^{-12}$–$10^{-14}$ S/cm).

Preferred supporting substrates include, but are not limited to, substrates selected from the group consisting of glass, quartz, polyester (Mylar), polycarbonate, polyacetates, polyacrylates, polymethacrylates and polysulfones.

Preferred cathode materials include, but are not limited to, members selected from the group consisting of indium/tin oxides that are transparent in the visible part of the spectrum, platinum, nickel, palladium and graphite. Also included are thin layers of "p-type doped" conjugated polymers, such as polypyrrole, polythiophene or polyaniline, which may be interposed between a metallic layer and the EL polymer layer.

During the conversion step, halogen precursor polymer is converted to the corresponding PPV film via dehydrohalogenation.

Preferably, conversion of the deposited halogen precursor polymer is performed at a temperature of about 100° to 800° C., preferably 100°–300° C., and may be performed in a vacuum, in an inert atmosphere such as nitrogen and/or argon, or in a reducing atmosphere such as hydrogen. Optionally, conversion can be accomplished at room temperature in the presence of an organic solvent vapor.

In another embodiment, an electron transport layer can be deposited on the converted conjugated polymer to give two-layer EL devices. Preferred electron transport materials include, but are not limited to, materials selected from inorganic semiconductors such as: n-doped silicon (amorphous or crystalline), silicon with an oxide coating, silicon carbide, Group II–VI semiconductors such as cadmium sulfide, cadmium selenide, zinc sulfide and the like, Group III–V semiconductors such as gallium arsenide, indium phorsphide and the like, alkali and alkaline-earth metals either pure or alloyed with other metals such as silver; and organic compounds and polymers such as: 7,7,8,8-tetracyanoquinodimethane, 1,2,4,5-tetracyanobenzene, 4-(n-butoxycarbonyl-9-fluorenylidene) malonitrile , 4-(dicyanomethylene)-2-methyl-6-(p-dimethylaminostyryl) 4H-pyran, 4,4'-diphenoquinone, 2,6-bis(phenyl)benzo[1,2-d: 4,5-d']dioxazole, 2,6-bis-(phenyl)benzo[1,2-d:4,5-d']bisthiazole, α,α-dibenzylidene-p-benzene-diacetonitrile, 2,5-bis(phenyl)-1,3,4-thiadiazole, aluminum trisquinolate, gallium trisquinolate, perylene tetracarboxyl derivatives, 2,4'-(tert-butylphenyl)-5-(biphenyl)-1,3,4-oxadiazole and poly(cyanoterephthalylidenes). In addition, thin layers of "n-type doped" conjugated polymers may be interposed between a metallic layer and the light emitting layer to form the electron-injecting layer.

The above mentioned materials are preferably applied as follows: all metals, except those with very high melting temperatures, such as platinum, can be deposited by evaporation; all metals including indium/tin oxide can be deposited using DC or RF sputtering and also electron beam evaporation; for amorphous silicon, deposition can be accomplished by glow-discharge deposition from mixtures of silane and dopants such as phosphine; III–V and II–VI semiconductors can be deposited by solvent coating using their fine particles that are dispersible in a polymer binder and a solvent by solvent coating. Preferably, spin-, drawor gravure- coating, and the like may be used as the methods for applying the precursor polymer to the electroded substrate.

Preferred bases for the polymerization of 1,4-bis(halomethyl)benzene monomers have pKa values of about 10 to 40. Preferred bases include, but are not limited to, bases selected from the group consisting of:

1) metal alkoxides such as potassium t-butoxide, lithium pentoxide and the like; 2) metal hydrides such as sodium hydride, lithium hydride and the like; 3) metal amides such as sodium amide, potassium amide, lithium diisopropylamide, lithium bis(trimethylsilyl)amide; and 4) metal triphenylmethanes, such as triphenylmethyl lithium, triphenylmethyl sodium and triphenylmethyl potassium. Combinations of bases can be used if desired.

Preferred solvents for polymerization of 1,4-bis(halomethyl)benzene monomers include, but are not limited to, solvents selected from the group consisting of: t-butyl alcohol, ether, 1,2-dimethoxyethane, benzene, tetrahydrofuran, toluene, liquid ammonia, dimethylformamide and the like.

Solvents for dissolving halogen precursor polymers preferably have boiling points less than about 150° C. Preferred solvents include, but are not limited to, solvents selected from the group consisting of: methylene chloride, chloroform, chlorobenzene, 1,2-dichloroethane, acetone, acetonitrile, ethyl acetate, methyl ethyl ketone, cyclohexanone, 1,1,2-trichloroethane, 2-dimethoxyethane, benzene, tetrahydrofuran, toluene, butyl acetate and the like solvents.

In another embodiment, copolymers of conjugated polymers can be prepared using vinyl or diene monomers according to well known techniques that are readily available to those of ordinary skill in the art. The resultant copolymers can be used to form light-emitting layers in EL devices according to the present invention.

The following reaction schemes illustrate processes according to the present invention.

Scheme I below illustrates a halogen precursor route, which may be used to prepare substituted PPV derivatives.

Scheme I

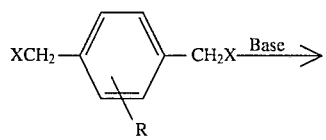

sustituted benzene monomer

X = Cl or Br
R = solubilizing group
a/b = 1/99–50/50
  (a is the degree of conversion)

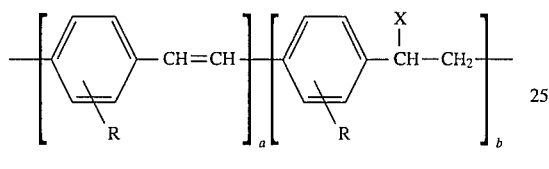

halogen precursor polymer $\downarrow$ −HX

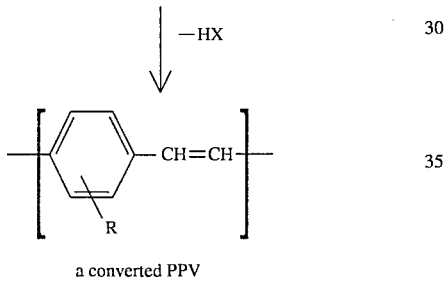

a converted PPV

Scheme I shows that a substituted 1,4-bis(halomethyl)benzene monomer in a solvent is treated with 1.0 to 1.5 equivalents of a base at a temperature of about −78° C. to about 30° C. to produce a halogen precursor polymer having a degree of conversion of about 1% to 50%. The resultant halogen precursor polymer is then dissolved in a solvent and deposited on a conductive substrate as a thin film using known deposition techniques. The thin film substrate is then thermally converted at a temperature of about 150° C. to about 300° C. to produce a PPV with degree of conversion of about 20–100% depending on the temperature and duration of the thermal conversion.

Preferred 1,4-bis(halomethyl)benzene monomers that may be used in accordance with the present invention include, but are not limited to, the following:

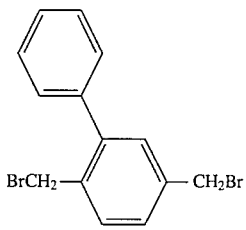

1,4-bis(bromomethyl)-
2-phenylbenzene

-continued

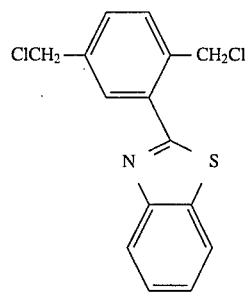

2-[2,5-bis(chloro-
methyl)-phenyl]
benzothiazole

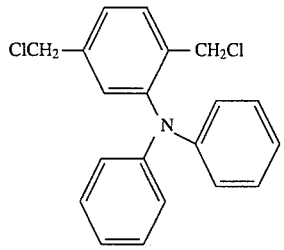

N-[2,5-bis(chloro-
methyl)phenyl]-N,N-
diphenylamine

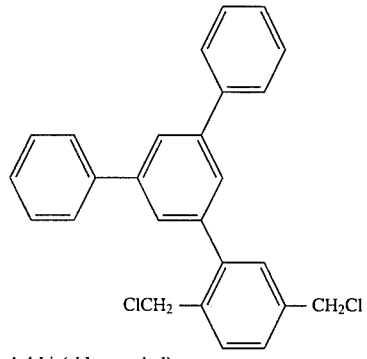

1,4-bis(chloromethyl)-
3',5'-diphenylphen-1'-yl-
benzene

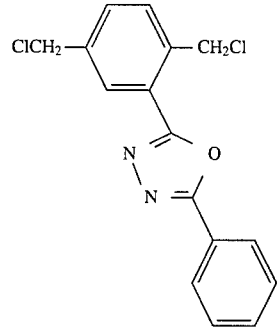

2-[1,4-bis(chloromethyl)-
phenyl]-5-phenyl-
1,3,4-oxadiazole

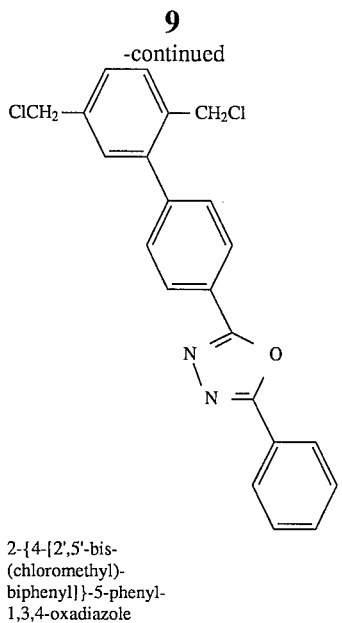

2-{4-[2',5'-bis-(chloromethyl)-biphenyl]}-5-phenyl-1,3,4-oxadiazole

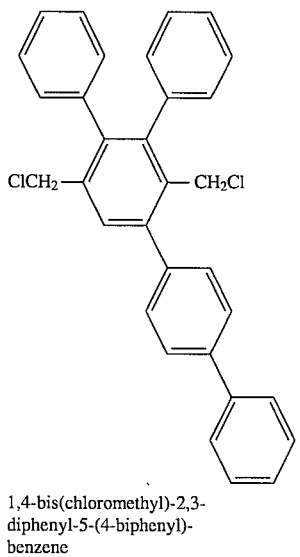

1,4-bis(chloromethyl)-2,3-diphenyl-5-(4-biphenyl)-benzene

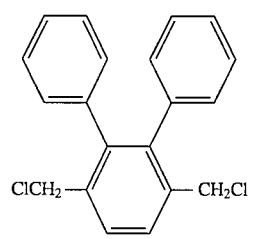

1,4-bis(chloromethyl)-2,3-diphenylbenzene

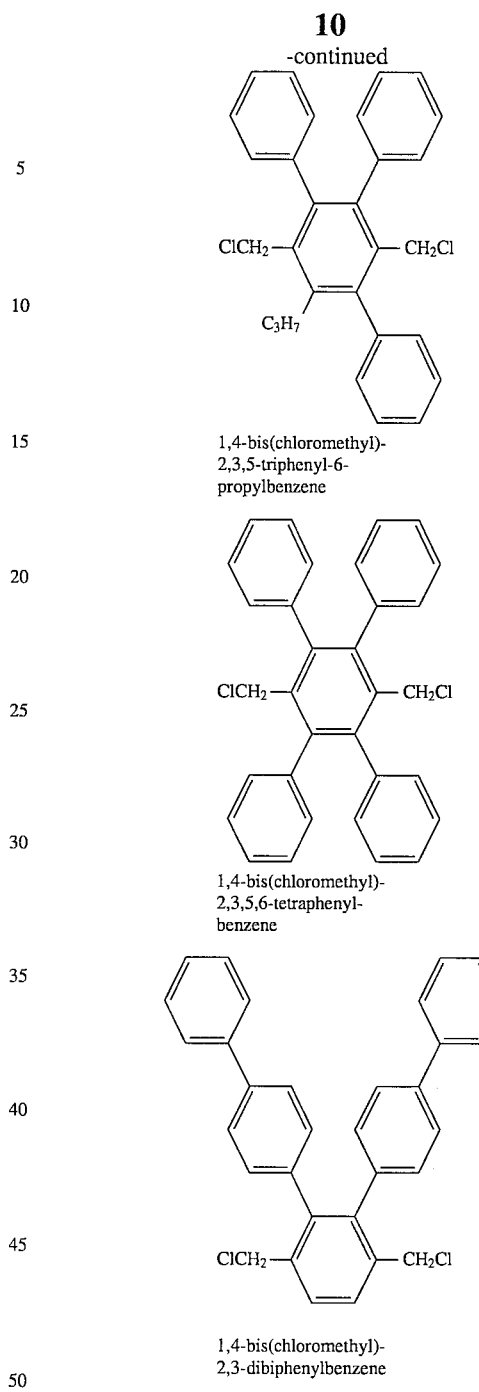

1,4-bis(chloromethyl)-2,3,5-triphenyl-6-propylbenzene 1,4-bis(chloromethyl)-2,3,5,6-tetraphenyl-benzene 1,4-bis(chloromethyl)-2,3-dibiphenylbenzene To prepare suitable substituted 1,4-bis(halomethyl)benzene monomers for use in Scheme I above, the following exemplary reaction Schemes II–V may be used: direct bromination or oxidation (Schemes II and III) and Diels Alder-type reaction (Schemes IV–V).

Scheme II
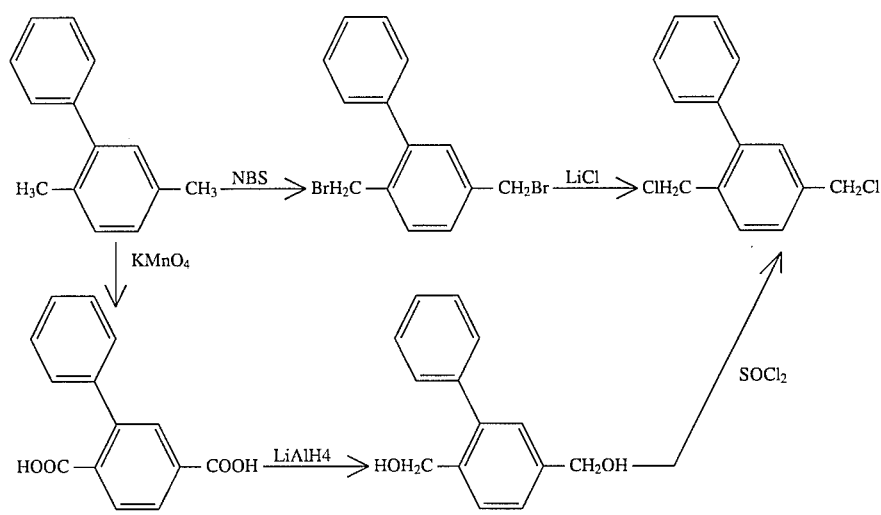
Scheme III
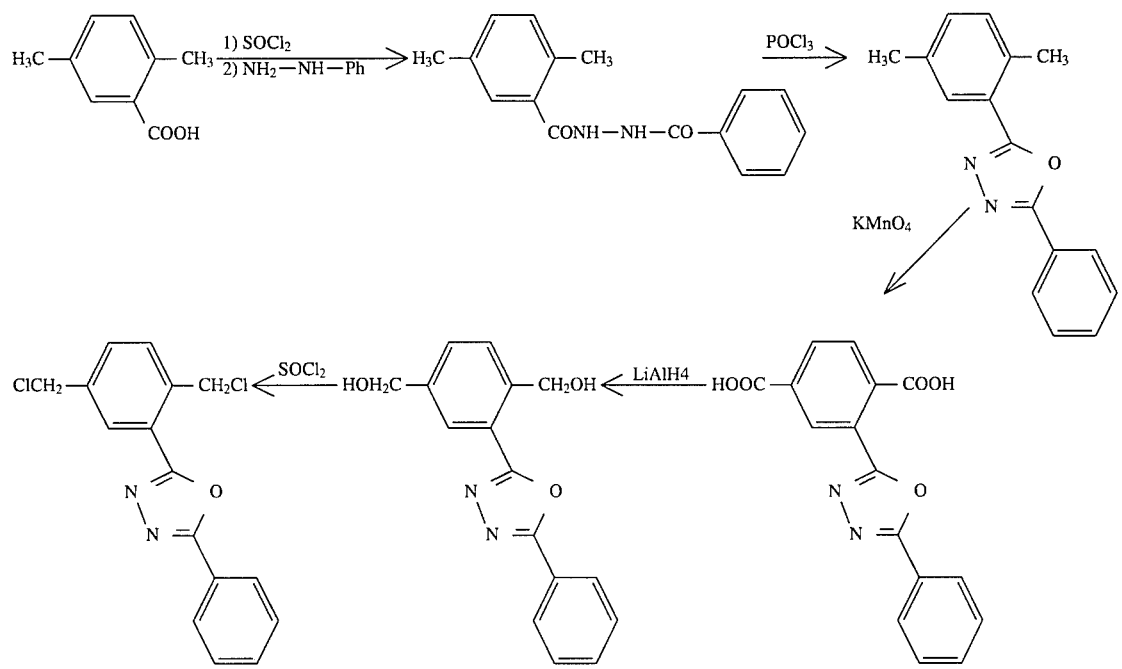

Scheme IV
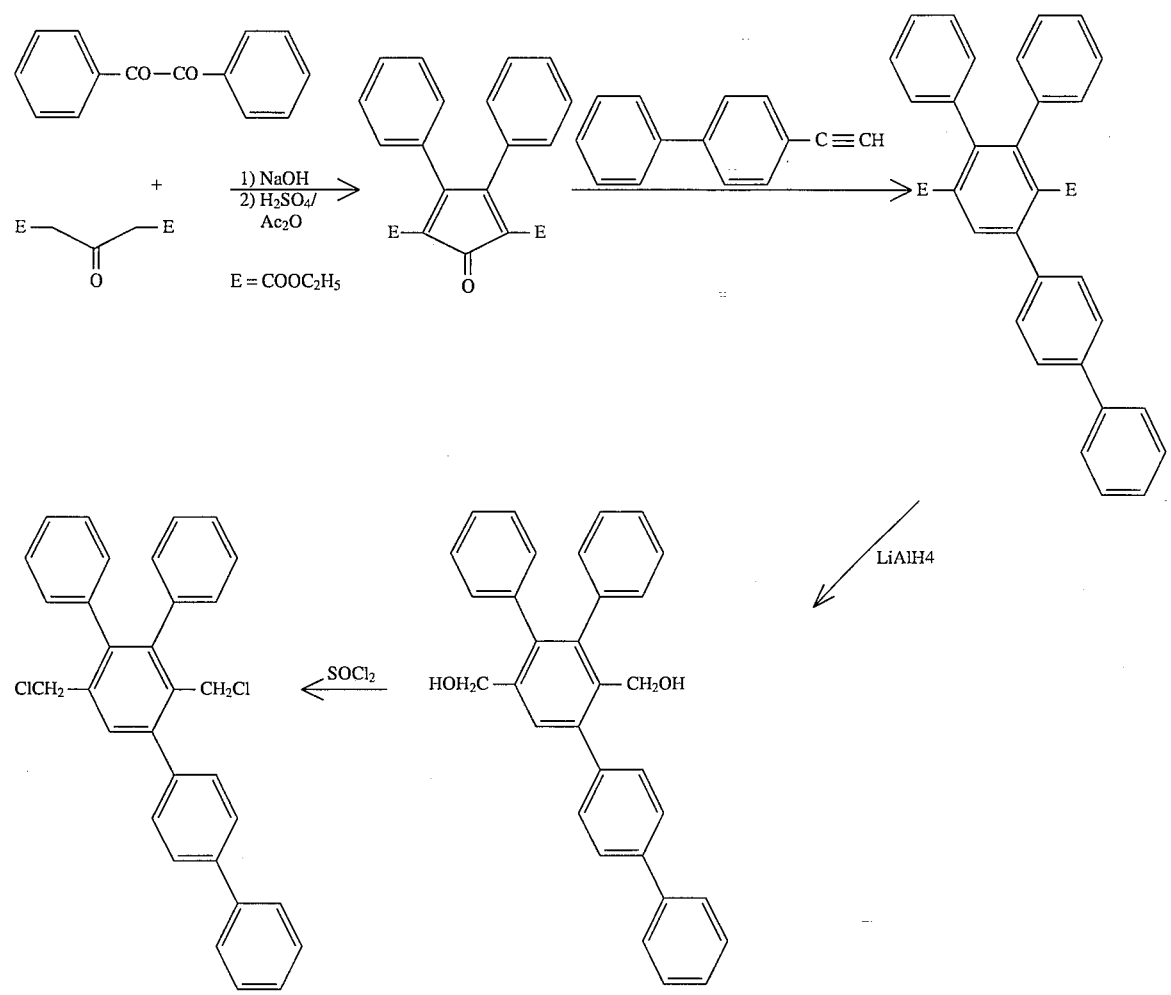

Scheme V

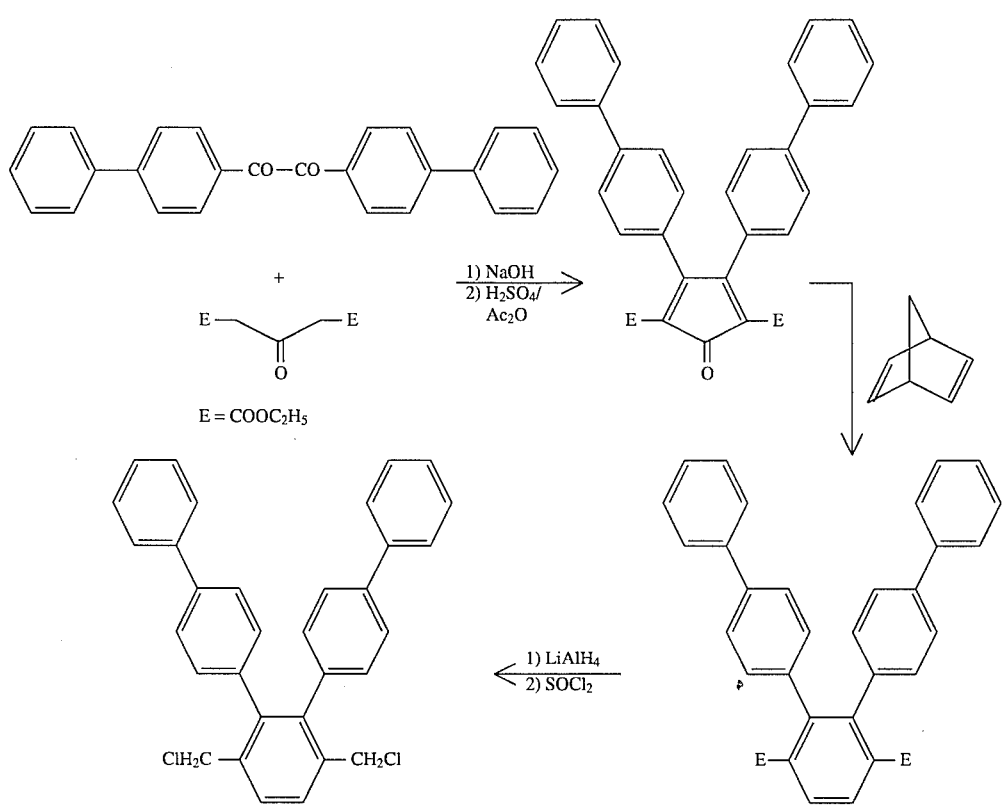

Scheme II illustrates the bromination of 1,4-dimethyl-2-phenylbenzene with N-bromosuccinimide (NBS) to obtain bis(bromomethyl)phenylbenzene monomer. The obtained bis(bromomethyl)phenylbenzene is allowed to undergo a halogen exchange reaction with lithium chloride to give 1,4-bis(chloromethyl)-5-phenylbenzene monomer. Alternatively, 1,4-dimethyl-2-phenylbenzene can be oxidized with potassium permanganate to produce 2-phenylterephthalic acid. The resultant 2-phenylterephthalic acid is then reduced using lithium aluminum hydride to obtain a dialcohol that is then allowed to react with thionyl chloride to produce bis(bromomethyl)phenylbenzene monomer.

Scheme III shows the reaction of 2,5-dimethylbenzoic acid chloride with benzoic hydrazide in the presence of triethylamine to give 1-(1,4-dimethylbenzoyl)-2-benzoylhydrazine. The resultant 1-( 1,4-dimethylbenzoyl)- 2-benzoylhydrazine is then allowed to cyclize in the presence of phosphorus chloride to give 2-(1,4-dimethylphenyl)-5-phenyl-1,3,4-oxadiazole, that then undergoes direct bromination or oxidation, as described above, to produce bis(bromomethyl) and bis(chloromethyl) monomers.

Scheme IV shows the reaction of benzil and diethyl-1,3-acetonedicarboxylate in a mixture of sodium hydroxide and methanol followed by treatment with sulfuric acid to give cyclopentadienone, which then is allowed to undergo a Diels Alder-type reaction with 4-biphenylacetylene to produce diethyl terephthalate. The resultant diethyl terephthalate is then reduced with lithium aluminum hydride to give the corresponding dialcohol that then reacts with thionyl chloride to produce a bis(chloromethyl) benzene monomer.

Scheme V shows a similar Diels Alder-type reaction sequence for the synthesis of 1,4-bis(chloromethyl)-2,3-di(biphenyl)benzene.

Additional monomers that can be used according to Scheme I include, but are not limited to, fused ring hydrocarbon monomers and heterocyclic monomers shown below.

Examples of Fused Ring Hydrocarbon Monomers

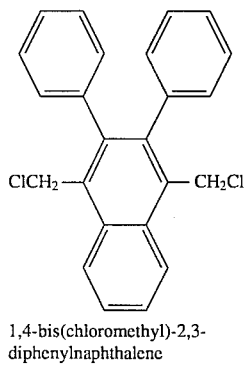

1,4-bis(chloromethyl)-2,3-diphenylnaphthalene

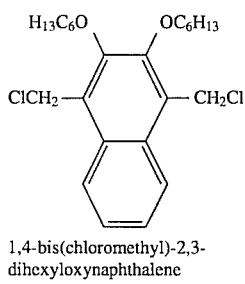

1,4-bis(chloromethyl)-2,3-dihexyloxynaphthalene

17
-continued 2,6-bis(chloromethyl)-
naphthalene 1,4-bis(chloromethyl)-3-
phenyltriphenylene 9,10-bis(chloromethyl)-
anthracene 1,4-bis(chloromethyl)-
9,9-di(n-butyl)fluorene 1,4-bis(chloromethyl)-
9,9-diphenylfluorene

18

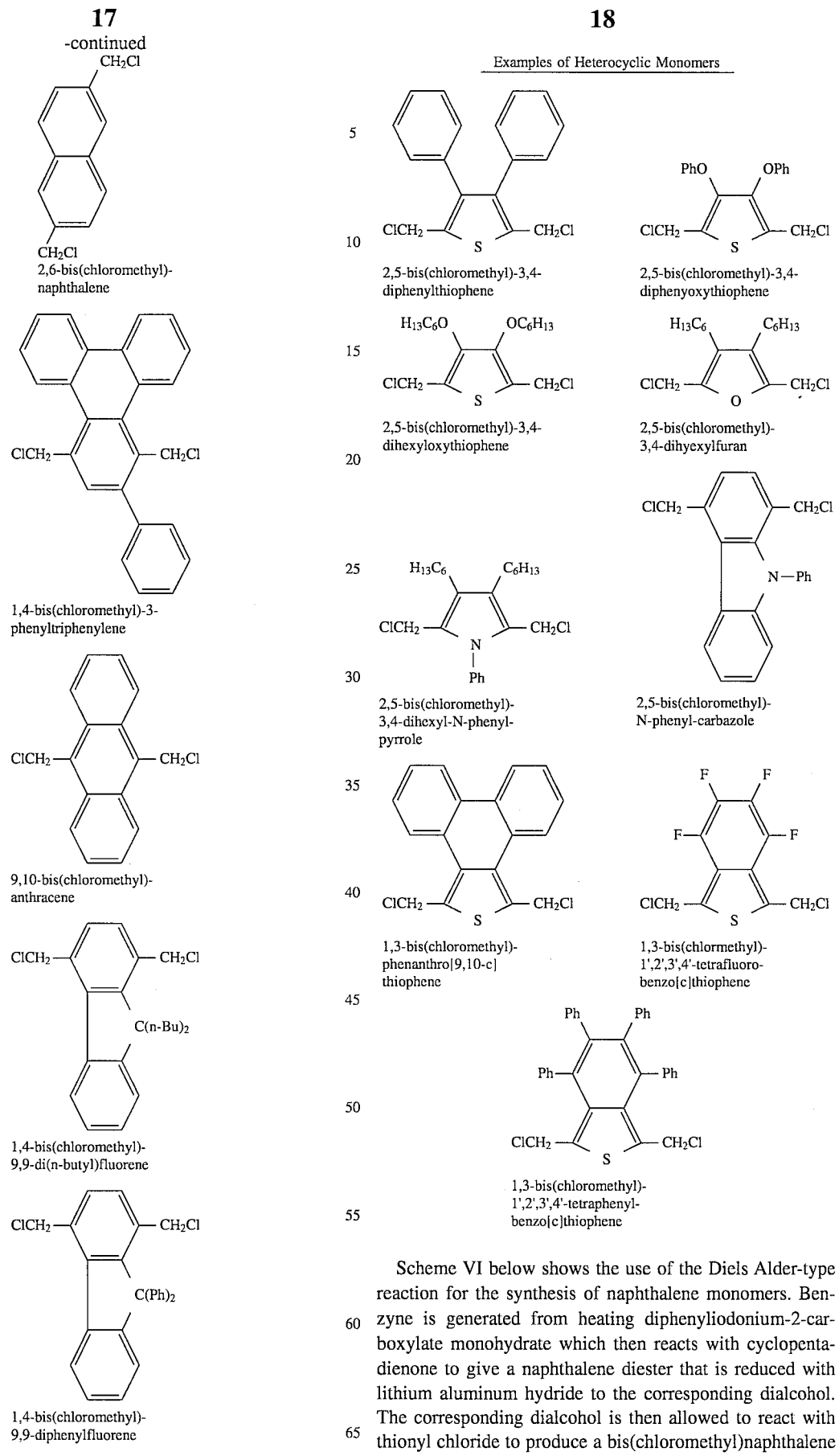

Examples of Heterocyclic Monomers 2,5-bis(chloromethyl)-3,4-
diphenylthiophene 2,5-bis(chloromethyl)-3,4-
diphenyoxythiophene 2,5-bis(chloromethyl)-3,4-
dihexyloxythiophene 2,5-bis(chloromethyl)-
3,4-dihyexylfuran 2,5-bis(chloromethyl)-
3,4-dihexyl-N-phenyl-
pyrrole 2,5-bis(chloromethyl)-
N-phenyl-carbazole 1,3-bis(chloromethyl)-
phenanthro[9,10-c]
thiophene 1,3-bis(chlormethyl)-
1',2',3',4'-tetrafluoro-
benzo[c]thiophene 1,3-bis(chloromethyl)-
1',2',3',4'-tetraphenyl-
benzo[c]thiophene Scheme VI below shows the use of the Diels Alder-type reaction for the synthesis of naphthalene monomers. Benzyne is generated from heating diphenyliodonium-2-carboxylate monohydrate which then reacts with cyclopentadienone to give a naphthalene diester that is reduced with lithium aluminum hydride to the corresponding dialcohol. The corresponding dialcohol is then allowed to react with thionyl chloride to produce a bis(chloromethyl)naphthalene monomer.

Scheme VII below shows the preparation of another naphthalene monomer via two different routes. Vilsmeier-Haack reaction of 2,3-dihydroxynaphthalene produces a diformylated product that is allkylated with n-hexylbromide and then reduced with sodium borohydride of the formyl groups to produce an alcohol. The resultant alcohol is then treated with thionyl chloride to give the 1,4-bis(chloromethyl)-2,3-dihexyloxynaphthalene, that can alternatively be prepared by hydroxymethylation of 2,3-dihydroxynaphthalene, followed by alkylation and treatment with thionyl chloride, as also shown in Scheme VII.

Scheme VI

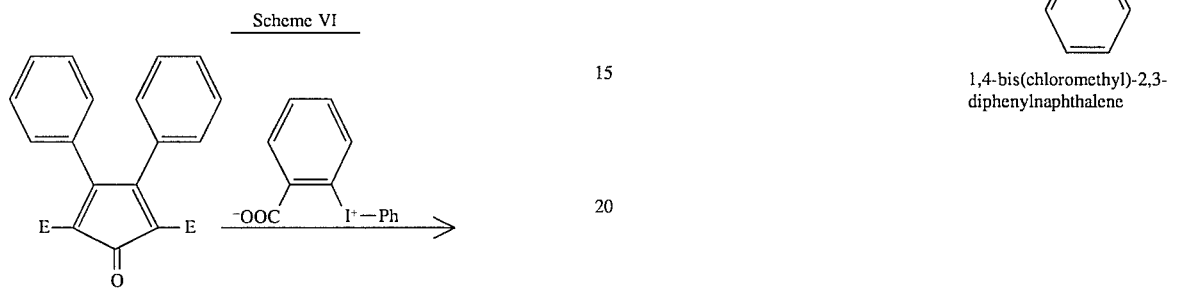

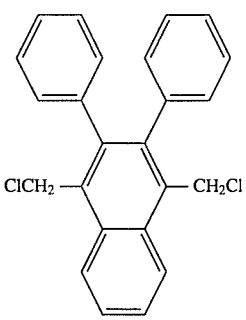

1,4-bis(chloromethyl)-2,3-diphenylnaphthalene

Scheme VII

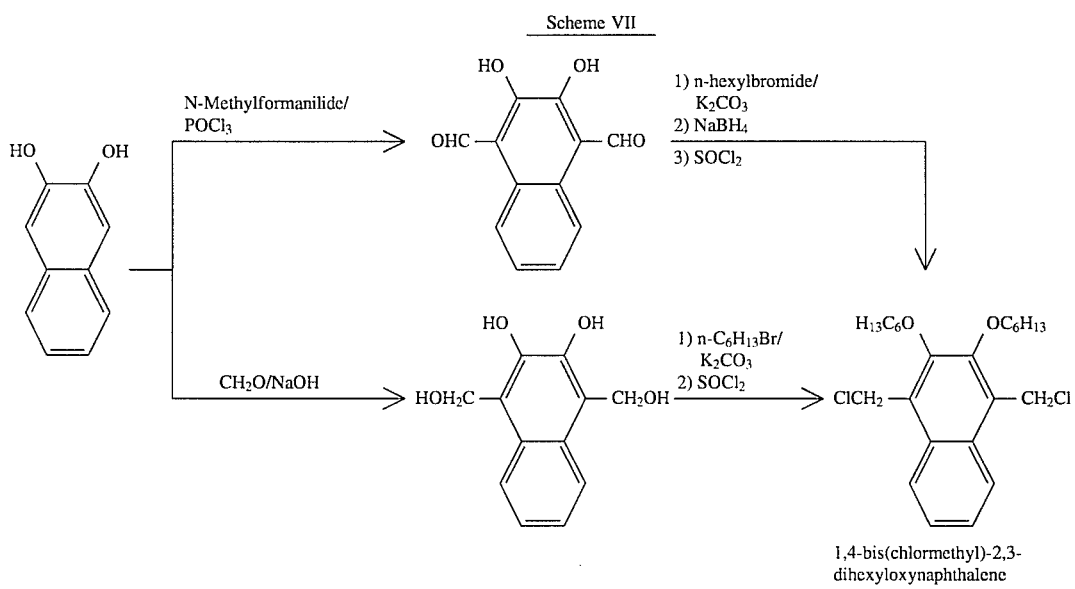

1,4-bis(chlormethyl)-2,3-dihexyloxynaphthalene

-continued
Scheme VI

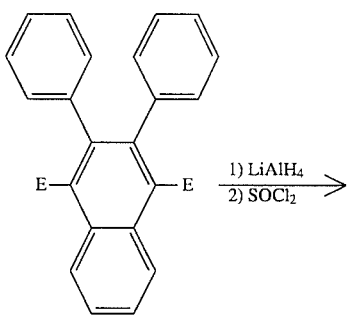

Schemes VIII and IX below show suitable synthesis routes for producing suitable heterocyclic monomers. In particular, Scheme VIII shows benzil reacts with diethyl thiodiacetate in a sodium methoxide/methanol solution to yield diphenylthiophene dicarboxylic acid, which is then decarboxylated with copper bronze to produce the diphenylthiophene. The diphenylthiophene is then chloromethylated with hydrochloric acid and paraformaldehyde to give 2,5-bis(chloromethyl)-3,4-diphenylthiophene. Alternatively, the diphenylthiophene dicarboxylic acid can be reduced with lithium aluminum hydride to the corresponding dialcohol followed by reacting with thionyl chloride to give bis(chloromethyl)thiophene monomer.

As shown in Scheme IX, o-phthaloyl chloride is reacted with sodium sulfide under phase transfer conditions to produce thiophthalic anhydride that is then converted to a tetrachloride using phosphorus pentachloride and phosphorus oxychloride. The tetrachloride reacts with sodium iodide in cold dimethylformamide (DMF) to yield the dichloride that is then lithiated with n-butyllithium followed by reaction with DMF to produce the dialdehyde. The dialdehyde is then reduced with sodium borohydride to produce the corresponding alcohol, which is then converted to the bis(chloromethyl)benzothiophene monomer.

Scheme VIII

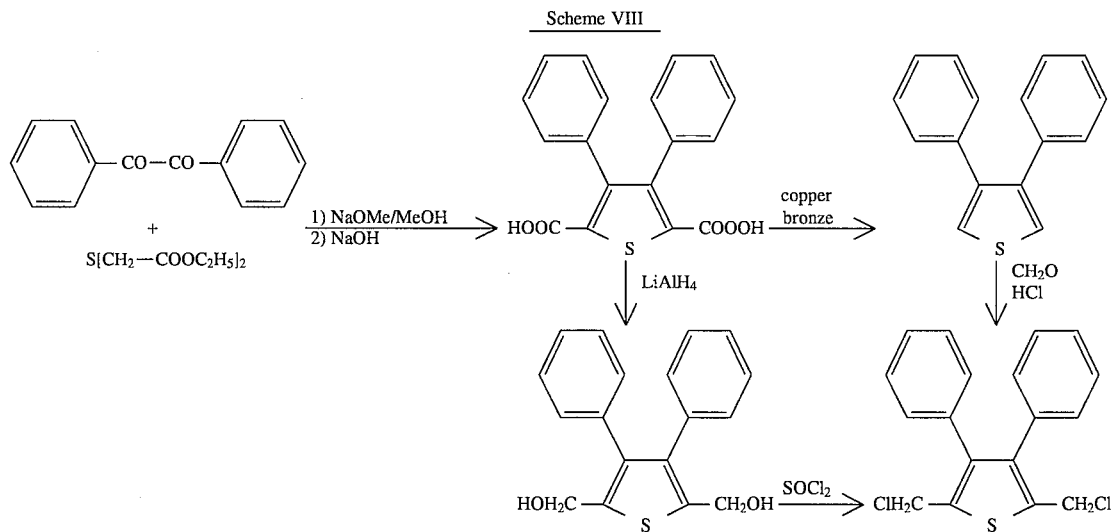

Scheme IX

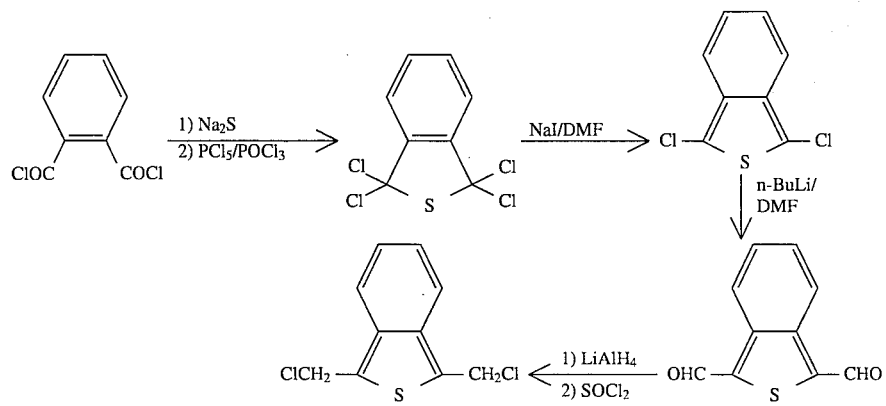

Scheme X below shows the general polymerization route for producing a substituted PPV, having a group attached to the vinylene unit, using a dihalomethyl monomer with an activated or acidic methylene group (G-CH$_2$) at the para position. The monomer, in a solvent, is treated with 1.0 to 1.5 equivalents of base at any temperature between about −78° to 30° C. to give a halogen precursor polymer with 1 to 50% conversion. This polymer is dissolved in a solvent and deposited on a conductive substrate as a thin film. The thin film substrate is then thermally converted to a substituted PPV with a degree of conversion of about 20–100% depending on the temperature and duration of the thermal conversion.

Scheme X

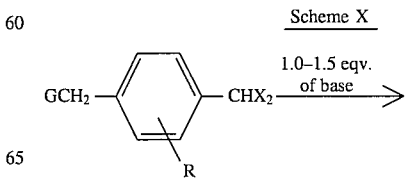

Scheme X -continued

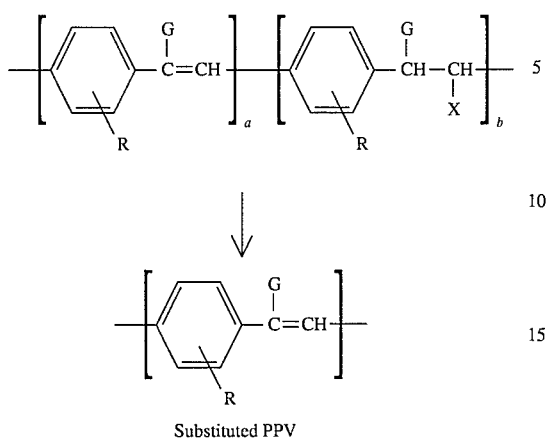

Substituted PPV wherein G is hydrogen, alkyl, phenyl, alkoxy, phenoxy or an electron withdrawing group such as CN, F, $CF_3$, $CF_2CF_3$; $(CF_2)_4CF_3$;4-cyanophenyl $PO(OBu)_2$; SOPO; $S)_2Ph$, $Si(CH_3)_3$5-phenyl-1,3,4-thiadiazol-2-yl; 5-t-butyl-1,3,4-thiadiazol-2-yl; 5-phenyl-1,3,4-oxadiazol-2-yl; 5-t-butyl-1, 3,4-oxadiazol-2-yl; benzothiazol-2-yl; benzoxazol-2-yl; 1-phenylbenzimidazol-2-yl; 4,5-diphenyltriazol-3-yl; pyrid-2-yl; quinol-2-yl; quinoxal-2-yl or the like;

X is Cl or Br;

R is solubilizing group (This may not be needed for monomers with large G groups because they may serve the purpose); and a/b is 1/99–50/50 (where a is the degree of conversion). Several specific monomer examples suitable for use in reaction Scheme X, include, but are not limited to, the following:

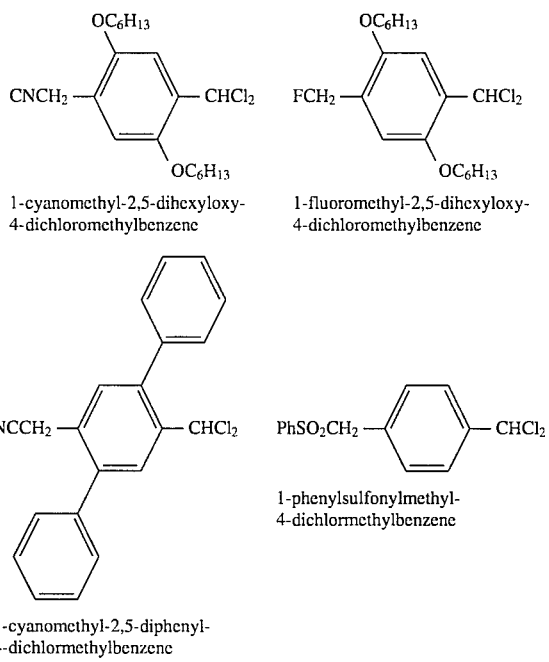

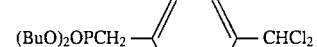

1-[bis-(t-butoxy)phosphorylmethyl]-
4-dichlormethylbenzene

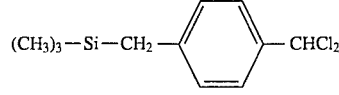

1-trimethylsilylmethyl-
4-dichloromethylbenzene

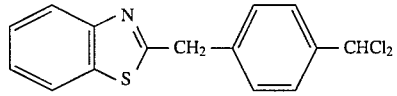

1-(benzothiazol-2-yl)methyl-
4-dichloromethylbenzene

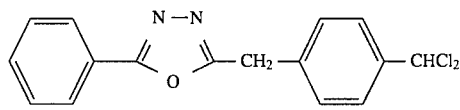

1-(5-phenyl-1,3,4-oxadiazol-2-yl)methyl-
4-dichloromethylbenzene

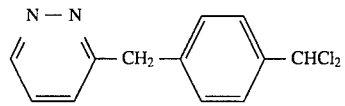

1-(pyridaz-2-yl)methyl-
4-dichlormethylbenzenepyridazine

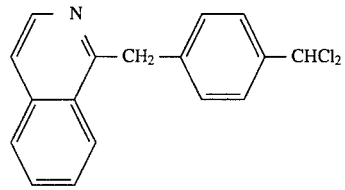

1-(quinol-2-yl)methyl-
4-dichlormethylbenzene

Schemes XI and XII below show the synthesis of monomers that can be used to produce the PPVs shown in Scheme X. As shown in Scheme XI, the hydroxymethyl group of the diphenyl hydroxymethylaldehyde (see Scheme XII) is reacted with toluenesulfonyl chloride to form a tosylate group that is then replaced with cyano groups via treatment with sodium cyanide to give the cyanomethylaldehyde monomer.

Scheme XII below shows the synthesis of two monomers containing electron withdrawing heterocyclic groups. In the presence of triethylamine, 1-(4-bromobenzoyl)-2-benzoyl-hydrazine and p-bromophenylacetic acid is converted to the corresponding acid chloride followed by reaction with benzoic hydrazide that cyclizes in the presence of phosphorus chloride to give 2-(4-bromophenyl)-5-phenyl-1,3,4-oxadiazole. The bromine group reacts with NaCN to form a cyano group that is then reduced by diiodobutylaluminum hydride to obtain an aldehyde group. This is finally converted to dichloromethyl groups with $PCl_5$. p-Bromophenylacetic acid reacts with 2-aminothiophenol in polyphosphoric acid to give 1-(benzothiazol-2-yl)-methyl-4-bromobenzene. This is then converted to the 1-(benzothiazol-2-yl)-methyl-4-dichloromethyl benzene in three steps, as indicated.

Scheme XI
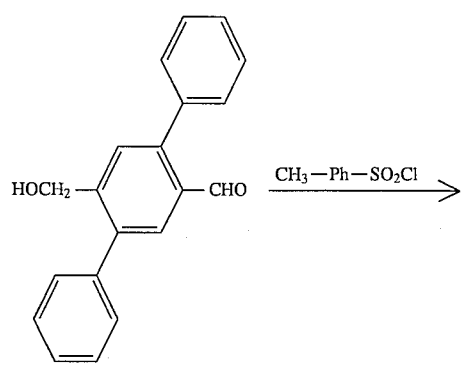
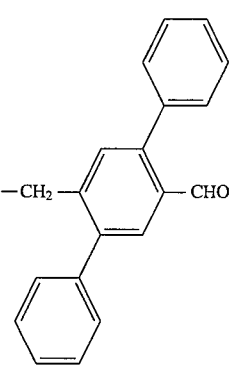
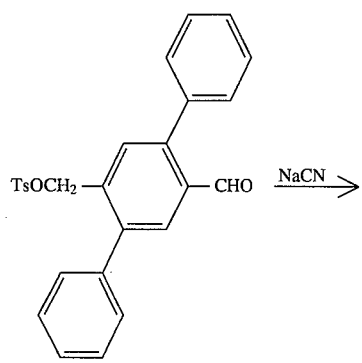
Scheme XII
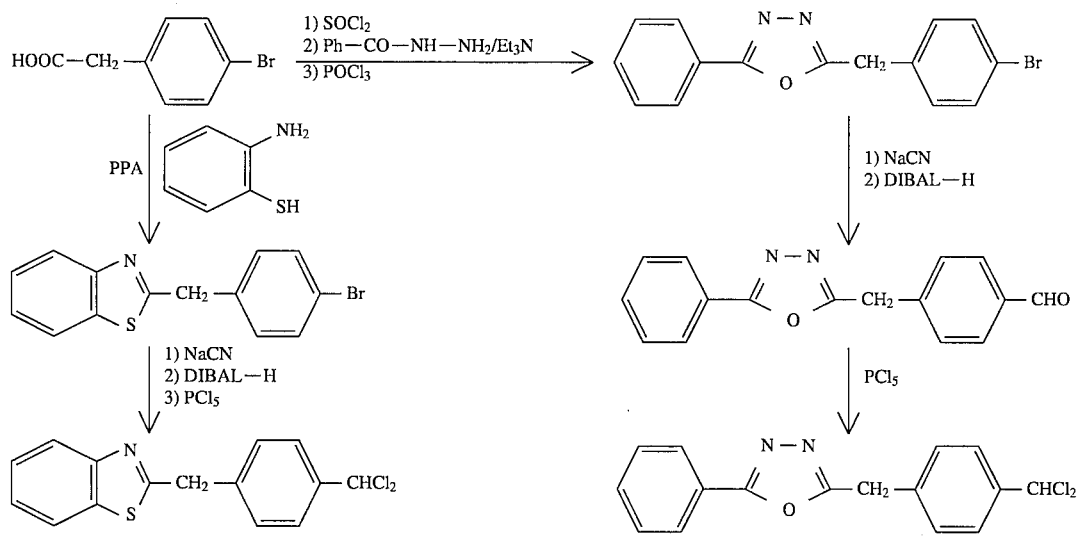

Scheme XIII below illustrates the production of poly(phenyleneacetylene) conjugated polymers using halogen precursor route chemistry. In particular, Scheme XIII shows the general polymerization reaction sequence for a trihalo monomer that is treated with 1.0 to 1.5 equivalents of a base at a temperature between about −78° C. to about 30° C. to give a halogen precursor polymer with about 1 to 50% conversion. This polymer is then dissolved in a solvent and then deposited on a conductive substrate as a thin film. The thin film substrate is then thermally converted to a poly(phenylene acetylene) with a degree of conversion of about 20–100% depending on the temperature and duration of the thermal conversion.

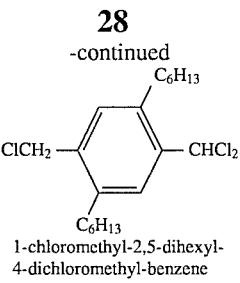

1-chloromethyl-2,5-dihexyl-
4-dichloromethyl-benzene

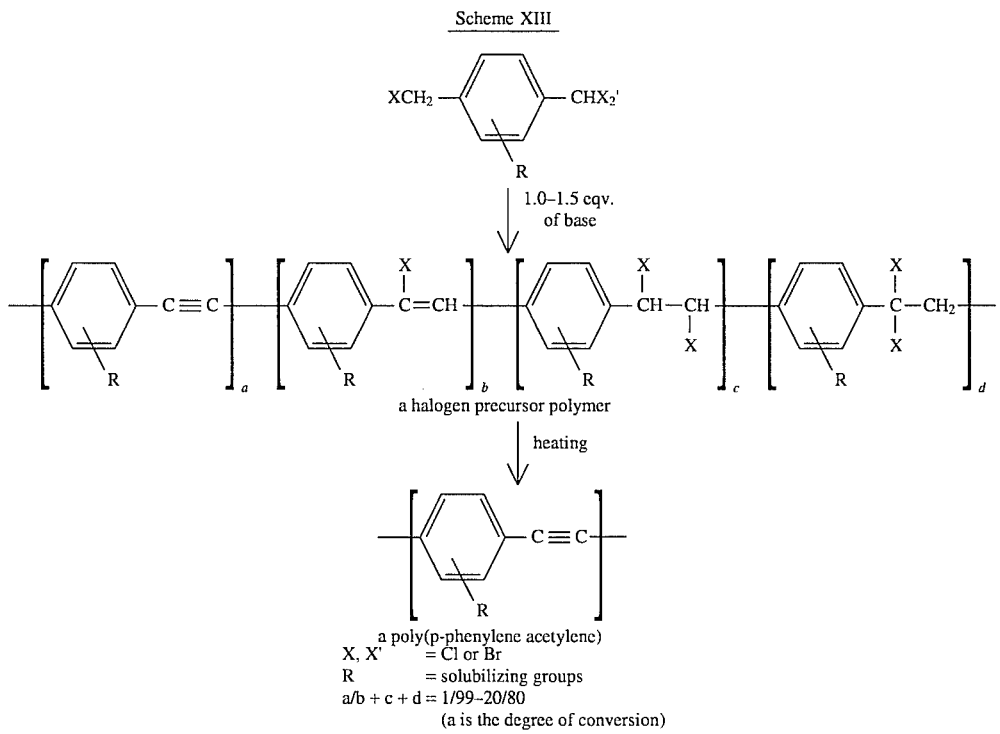

a poly(p-phenylene acetylene)
X, X'     = Cl or Br
R         = solubilizing groups
a/b + c + d = 1/99–20/80
(a is the degree of conversion)

Several specific monomer examples suitable for polymerization according to Scheme XIII include, but are not limited to, the monomers shown below.

1-chloromethyl-4-dichloro-
methylbenzene

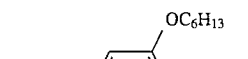

1-chloromethyl-2,5-dihexyloxy-
4-dichloromethylbenzene

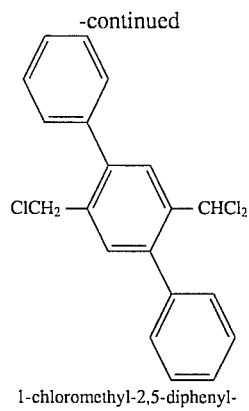

1-chloromethyl-2,5-diphenyl-
4-dichloromethylbenzene

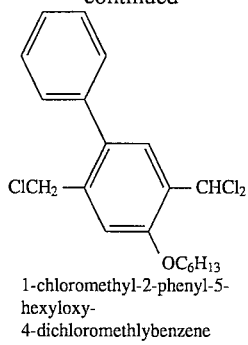

1-chloromethyl-2-phenyl-5-
hexyloxy-
4-dichloromethlybenzene

Schemes XIV and XV below show the synthesis of two trihalo monomers. In Scheme XIV, 2-methyl-p-hydroquinone is alkylated with n-hexylbromide followed by Vilsmeier-Haack formylation to give the dihexyloxytolualdehyde. This is treated with PCl$_5$ to give the corresponding dichloromethyl compound that is then chlorinated with sulfuryl chloride to the trichloro monomer. Scheme XV illustrates the reaction of diphenylquinone with methylsulphonium ylide (generated from the reaction of trimethyl sulphonium iodide with sodium hydride) to produce a bis oxirane. This is then treated with lithium bromide to produce the hydroxymethylaldehyde that is then converted to produce the diphenyl trichloro monomer.

Scheme XIV

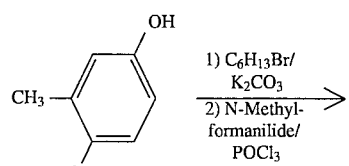

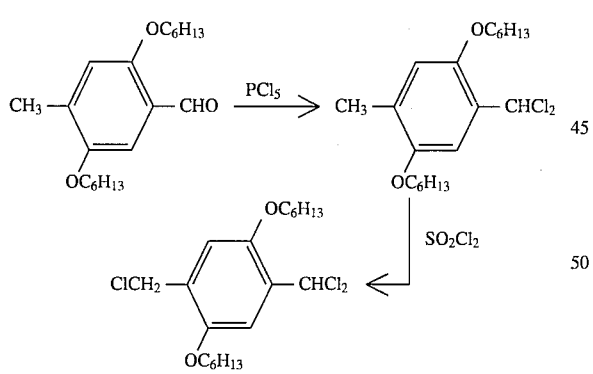

Scheme XV

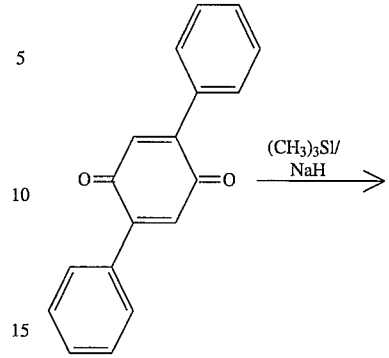

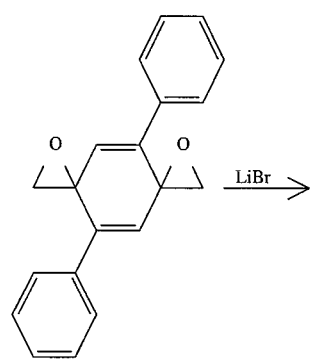

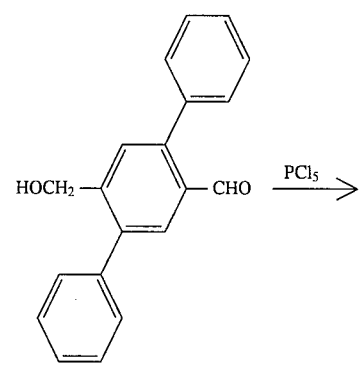

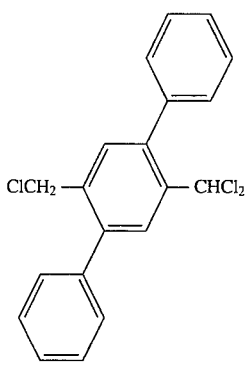

The invention will further be illustrated in the following examples, it being understood that the examples are intended to be illustrative only. Unless defined otherwise, all technical and scientific terms used herein have the same meaning as commonly understood by those of ordinary skill in the art to which this invention belongs. Although any methods and materials similar or equivalent to those described herein can be used in the practice or testing of the present invention, preferred methods and materials are now described. Unless mentioned otherwise, the techniques employed or contemplated herein are standard methodologies well known to one of ordinary skill in the art. The materials, methods and examples are illustrative only.

As noted above, the use of halogen precursor route chemistry to prepare halogen precursor polymers for thin film device fabrication provides an unexpected outcome due to the many limitations associated with sulphonium precursor route and Gilch dehydrochlorination route. Based on all the examples given herein, it will become readily apparent to one of ordinary skill that the halogen precursor route is a more simple, general and versatile approach compared to the sulphonium precursor route and the Gilch route for the fabrication of thin film devices.

The limitations, as exemplified in the following examples 1–4, literally forces one to resort to the halogen precursor route to fabricate thin film devices. For instance, Example 1 shows that the typical sulphonium procedure is not suitable for the preparation of dialkoxylated PPV due to the precipitation of its sulphonium precursor in water. This problem is generally encountered for sulphonium polymers derived from electron rich monomers. The synthesis of a sulphonium monomer is not always straight forward and successful, as shown in Example 2. Further, Examples 3 and 4 illustrate that the Gilch dehydrochlorination route does not always give soluble PPV derivatives even with relatively large solubilizing groups attached. One has to select, by painstaking and unpredictable trial and error, the rate of adding base for each and every monomer to gain a soluble product. One may also have to carefully select appropriate solvent systems to obtain a soluble product because the choice of solvent is an important factor in determining polymer molecular weight.

Examples 5–9 show the successful preparation of five different halogen precursor polymers via the halogen precursor route, each by using an almost identical procedure.

Examples 10 and 11 show the polymerization of monomers without solubilizing side groups to give insoluble halogenated precursor polymers. This indicates that solubilizing groups are needed to obtain a soluble halogen precursor. The requirement of having solubilizing groups is the only limitation for the halogen precursor route.

EXAMPLE 1

This example shows the unpredictable nature of sulphonium precursor route. 2,5-Dimethoxy-1,4-bis(chloromethyl)benzene, which is prepared by chloromethylation of 1,4-dimethoxybenzene according to the procedure described in *The Journal of American Chemical Society*, 115:10117 (1993), the entire disclosure of which is incorporated herein by reference, (17 g, 0.0723 mol), tetrahydrothiophene (19 g, 0.216 mol) and methanol (60 ml) are added into a 250 ml round bottom flask equipped with a magnetic stirring bar and a condenser. The resulting mixture is heated at 50° C. for 5 hours and then cooled. The precipitated product is collected by suction filtration and washed with methylene chloride and then dried under vacuum for 6 hours to give the corresponding sulphonium monomer, namely 2,5-dimethoxy-p-xylylenebis(tetrahydrothiophenium chloride), (20 g, 67%) as a white powder. The sulphonium monomer (10 g) and water (100 ml) are placed into a 1 L three neck round bottom flask equipped with a mechanical stirrer, an addition funnel, a thermometer, an argon inlet and an ice water bath to give an aqueous solution. The funnel is charged with a 0.95 N aqueous sodium hydroxide solution (29 g). Both aqueous solutions are deoxygenated by bubbling argon for 30 min. The sodium hydroxide solution is added quickly. Precipitation of product is observed shortly after the addition. The product cannot be redissolved in water or methanol. The precipitation problem is generally encountered for sulphonium polymers derived from electron rich monomers such as 2,5-bis(chloromethyl)thiophene and the like.

EXAMPLE 2

This example shows the unpredictable nature of sulphonium monomer synthesis. 1,4-Bis(chloromethyl)-2,3-diphenyl-benzene is the starting material and is prepared according to the procedure published in *Polymer Preprints*, 32 (1):192 (1991), the entire disclosure of which is incorporated hereby by reference. The starting material (6.6 g, 0.02 mol), tetrahydrothiophene (7 g, 0.08 mol) and methanol (30 ml) are heated at 50° C. for 24 hours and then cooled. The resulting solution is poured into methylene chloride (200 ml) to induce product precipitation. However, no precipitate is formed. The solvents are then removed completely to give an oil residue that cannot easily crystallize by trituration and dry ice cooling in the presence of non-solvents such as acetone, methylene chloride and toluene. A small amount of solid finally forms in acetone upon prolonged standing in a refrigerator. The solid is collected by suction filtration and dried in vacuum to give a hydroscopic tacky solid (0.5 g, 10%). The solid is likely to be impure and its poor yield make it useless for polymerization.

EXAMPLE 3

The Gilch dehydrohalogenation route is illustrated in this example for the synthesis of poly[2-methoxy-5-(2'-ethylhexyloxy)-1,4-phenylene vinylene]or MEH-PPV using 1,4-bis(chloromethyl)-2-methoxy-5-( 2'-ethylhexyloxy)-benzene as the monomer, which is prepared according to the procedure published in *The Journal of American Chemical Society*, 115:10117 (1993). The experimental set-up and general procedure for Gilch route and halogen precursor route is essentially identical as described in this example using potassium t-butoxide (t-BuOK) as the base and tetrahydrofuran (THF) as the solvent.

Procedure A: The monomer (1.0 g, 0.003 mol) is placed in a 250 ml three necked round bottom flask equipped with a magnetic stirring bar, a 60 ml addition funnel caped with a rubber septum, a vacuum adaptor and a rubber septum. The system is evacuated and purged with argon twice. Sodium dried tetrahydrofuran (THF, 50 ml) is added via a syringe into the flask and 1.0 M t-BuOK (18 ml, 0.018 mol in THF, available from Aldrich Chemical) is added via another syringe into the addition funnel precharged with THF (20 ml). The t-BuOK solution is added very slowly dropwise over 30 min. Orange gel forms during the addition. The reaction is continued for 1 hour and the resulting mixture is poured into methanol (300 ml). The gel is collected by suction filtration and air dried. This MEH-PPV product can not be redissolved in common organic solvents such as chloroform, THF, chlorobenzene, xylene and the like.

Procedure B: To the monomer (1.0 g, 0.003 mol), THF (60 ml) solution is added 1.0 M t-BuOK (3.0 ml, 0.003 mol). The resulting solution is stirred for one hour before adding additional 1.0 M t-BuOK solution (9.0 ml) dropwise. The reaction mixture gels during the addition. The gel is insoluble in low boiling organic solvents. After another several unsuccessful attempts, soluble MEH-PPV is prepared by the following procedure involving intervallic addition of diluted t-BuOK/THF over four hours.

Procedure C: The 1.0 M t-BuOK solution (10 ml, 0.01 mol) in the addition funnel is diluted with THF (50 ml). Five ml of the resulting t-BuOK solution is added initially to a stirring solution of 1,4-bis(chloromethyl)-2-methoxy- 5-(2'-ethylhexyloxy)-benzene (1.0 g) in THF (60 ml). One hour later, another 5 ml of the t-BuOK solution is added. This is repeated another hour later. The remaining t-BuOK solution is added after another hour to give a very thick red solution. The reaction is continued for another hour before pouring the reaction solution into methanol (500 ml). The red precipitate (0.4 g, 51%) is collected and air dried. This product is found to be soluble in THF and chloroform.

EXAMPLE 4

This example describes the polymerization of 1,4-bis-(chloromethyl)- 2,3-diphenyl-benzene via Gilch route using Procedure C in Example 3 to give mostly an insoluble product. This compound (1.0 g, 0.003 mol) is dissolved in dried THF (60 ml). 1.0 M t-BuOK (18 ml, 0.018 mol in THF) is diluted by adding it to an addition funnel precharged with THF (40 ml). Five ml of the resulting t-BuOK solution is added dropwise. One hour later, another 5 ml of the t-BuOK solution is added. One hour later, another 5 ml of the t-BuOK solution is added. This addition results in precipitation. The reaction mixture is filtered and the filtrate is evaporated to dryness. The residue is dissolved in small amount of chloroform and the resulting solution is added dropwise into methanol. The precipitate is collected and air dried to give 25 mg (5%) of soluble product. We are not able to obtain soluble polymer in at least 10 other experiments, including using benzene as the solvent. The following procedure also yields an insoluble product: 1,4-bis(chloromethyl)-2,3-diphenyl-benzene (1.0 g, 0.003 mol) is dissolved in dried THF (60 ml). 1.0 M t-BuOK (3 ml, 0.003 mol in THF) is added dropwise. The resulting solution is stirred for 2 hours before adding additional t-BuOK (7 ml, 0.007 ml). This causes the product to precipitate. The product is insoluble in the organic solvents.

EXAMPLE 5

The synthesis of halogen precursor polymers via halogen precursor route is illustrated in this Example. To a solution of 1,4-bis(chloromethyl)- 2-methoxy-5-(2'-ethylhexyloxy)-benzene (1.0 g, 0.003 mol) in THF (40 ml) is added 1.0 M t-BuOK (3.0 ml, 0.003 mol in THF) dropwise. The resulting solution is stirred for one hour and then poured into stirred methanol (200 ml). The precipitate is collected by suction filtration and air dried to give a light yellow chlorine precursor polymer (0.52 g, 66%), which is soluble in benzene, chloroform, toluene and THF.

EXAMPLE 6

This is another example of the halogen precursor route using 1,4-bis(chloromethyl)-2,3-diphenyl-benzene as the monomer. The reaction set-up is the same as that described in example 1. To a solution of the monomer (1.0 g, 0.003 mol) in THF (40 ml) is added 1.0 M t-BuOK (3.0 ml, 0.003 mol in THF) dropwise. The resulting solution is stirred for one hour at room temperature and then poured into a stirred methanol (200 ml). The precipitate is collected by suction filtration and air dried to give a light yellow chlorine precursor polymer (0.55 g, 56%). The number and weight average molecular weights of the polymer are 211,603 and 1,119,400 as determined by gel permeation chromatography (GPC). The elemental analiysis data of the polymer reveals 82.42 %C, 5.29 %H, 11.68 %Cl, indicating a 5% conversion for the as obtained polymer. A fraction of the polymer is heated at 230° C. for two hours and another fraction at 280° C. for two hours under argon atmosphere. The former shows 92.12% C, 5.55% H, 1.64% Cl, corresponding to 88% conversion. The latter shows 93.68% C, 5.55% H, 0.50% Cl, corresponding to 97% conversion. Heating at 280°–300° C. for two hours gives poly(2,3-diphenyl-p-phenylene vinylene) (DP-PPV) with about 100% conversion.

The precursor polymer of DP-PPV is spin cast onto an indium-tinoxide (hole injecting contact) coated 5×5 cm$^2$ square glass substrate to obtain homogeneous and uniform thin films of about 500 Å. The film is then thermally converted at 290° C. under flowing argon gas for two hours, followed by the thermal evaporation of metallic contacts of 500 Å thick Mg (50 Å/sec deposition rate) passivated by a 500Å thick Ag (5–10 Å/sec deposition rate). 49 circular (4mm in diameter) EL diodes are then fitted on the 5×5 cm$^2$ square glass substrates. The thickness of the DP-PPV film is determined using a Tensor Instruments Alpha-Step 200 profilometer.

All measurements are performed in ambient room conditions. UV-Vis-IR spectra are obtained with a commercial Varian Cary 5 spectrophotometer. Steady state PL measurements are performed on a Spex Fluorolog-2 fluorometer equipped with a DM3000F spectroscopy computer. The polymer films are positioned such that the emission is detected at 22.5° from the incident beam. For the EL measurements a pulse generator model HP 214B, with a pulse width of 100 μs and 10% duty cycle, is used as the voltage source. The current output of the EL device is measured directly on the 50 Ω input of an oscilloscope. The spectral dependence of the electroluminescent light is coupled to a monochromator with an optical fiber. The output of the monochromator is monitored by a flat response GaAs photomultiplier (model RCA C31034) biased at 900 V, the output of which is measured by an electrometer (model Keithley 617). Finally both the electrometer and the monochromator are controlled by a personal computer for the storage and processing of the data.

RESULTS

FIG. 1 shows the optical absorption spectrum of DP-PPV. The onset of the π–π* transition of DP-PPV is at about 490 nm with a maximum at 400 nm. A smooth absorption band without any evidence of vibronic structure is observed. The 30 nm of blue shift with respect to that of PPV together with the absence of any vibrational features can be rationalized in terms of disordered effects introduced by the two bulky phenyl substituents. As in P-PPV, the phenyl groups introduce additional structural disorder and cause a steric-induced inhibition of conjugation in the PPV backbone thus resulting in shorter conjugation segments.

Also shown are the PL and EL spectra. The PL emission spectrum corresponds to an excitation of 350 nm. The PL has a peak at 500 nm, indicating green light emission. The EL spectrum is measured in a ITO/DP-PPV/Mg device. Emission of green uniform light is also detected from the device when 7 Volts are applied on ITO. The PL and EL spectra are virtually identical in agreement with many other light-emitting-diodes made from n-conjugated polymers like PPV, MEH-PPV, BCHA-PPV, etc. The coincidence in the two spectra supports the notion that the same kinds of excitations are involved in the two cases, which is attributed to the radiative decay of the singlet polaron-exciton.

Figure 2:
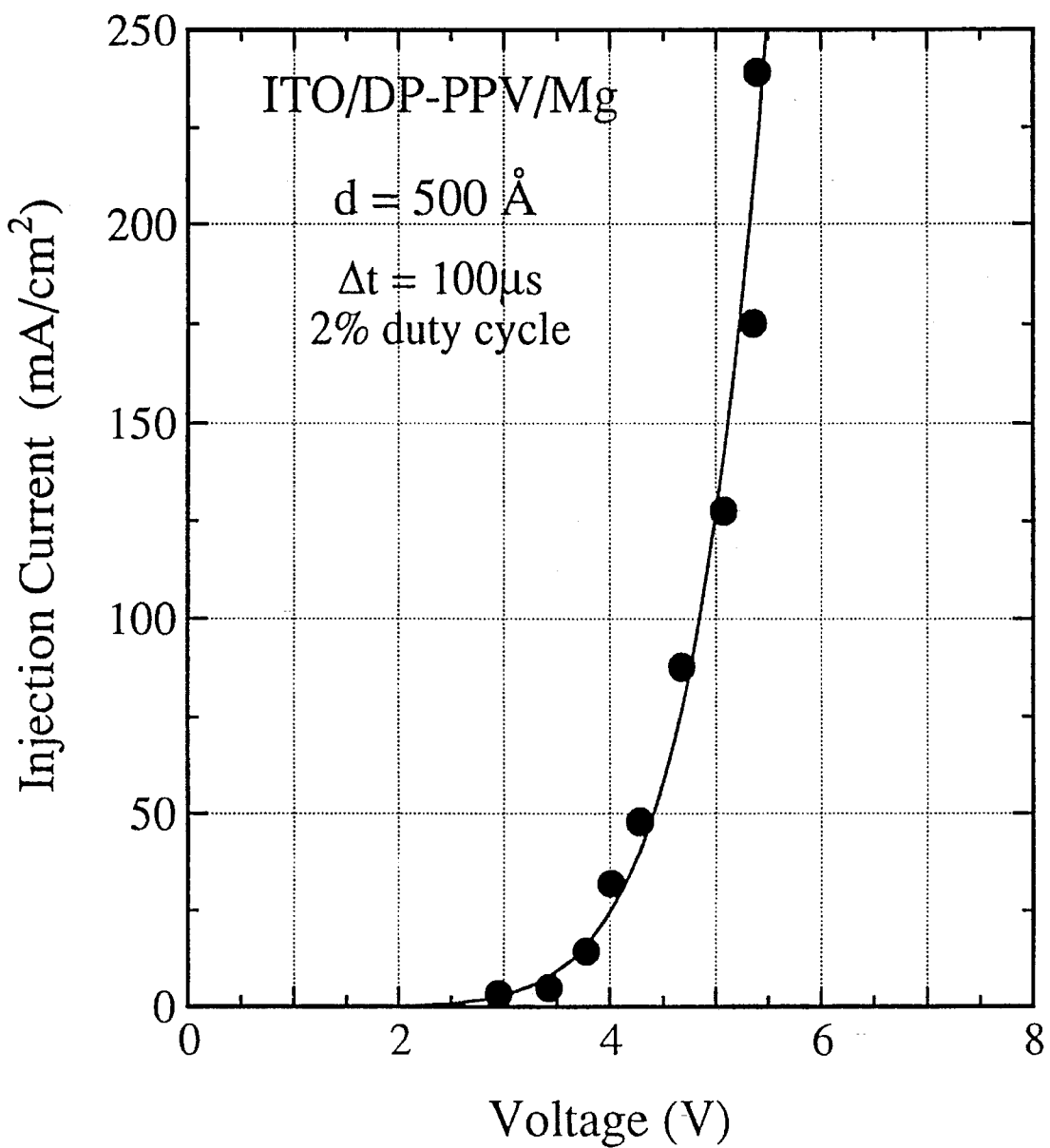
FIG. 2 shows injection current density versus applied voltage for an ITO/DP-PPV/Mg EL device. The thickness of DP-PPV is 500 Å.

FIG. 2 shows the forward current density versus applied voltage characteristics of a ITO/DP-PPV/Mg device. For this measurement the positive bias from the pulse generator is applied onto the ITO contact. Light emission becomes visible at a bias of about 3.5 Volts and a current density of 10 mA/cm$^2$. The corresponding electric field at the turn-on voltage is about $7 \times 10^5$ V/cm.

Figure 3:
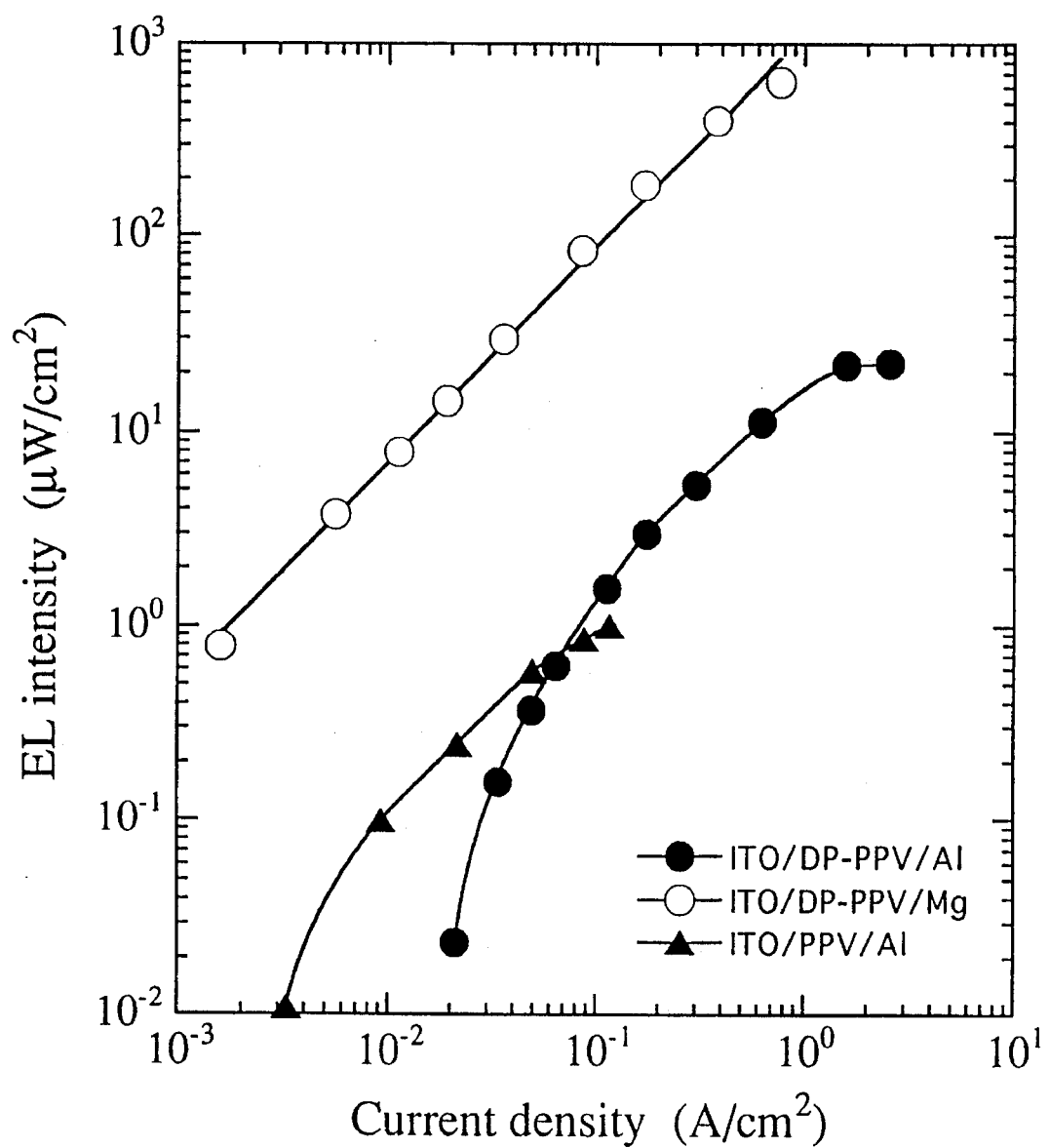
FIG. 3 shows EL intensity versus injection current density for two devices with the same DP-PPV thickness and having Al or Mg as electron injecting contacts. The EL intensity increases more than 50 times when Mg is used. The EL intensity for a ITO/PPV/Al device (PPV is about 500 Å) is shown for comparison.

FIG. 3 compares the EL emission intensity dependence upon the injection current for two devices with similar thickness of DP-PPV having Al or Mg as electron injecting contacts. The effect of different work functions ($\phi_{Al}$=4.28 eV and $\phi_{Mg}$=3.66 eV) on the EL efficiency is quite dramatic. The EL intensity increases more than 50 times when Mg is used. In that case a linear dependence of the EL intensity with injection current is observed.

Figure 4:
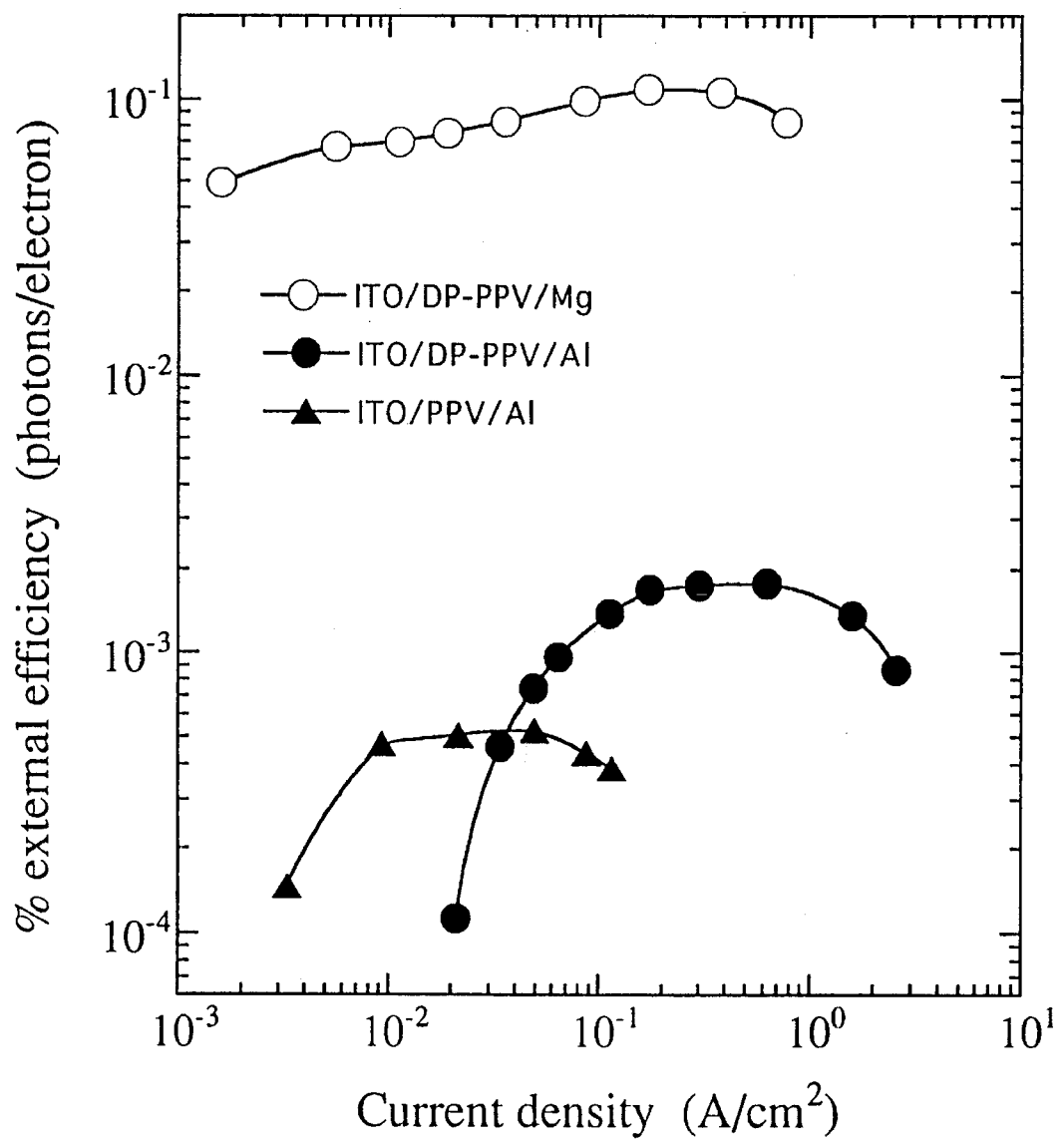
FIG. 4 shows external quantum efficiency versus injection current density, (defined as photons emitted per electron injected) for three EL devices.

FIG. 4 shows the external quantum efficiency for the two devices, defined as photons emitted per electron injected. In fact the ITO/DP-PPV/Mg device exhibits an efficiency up to 0.1% photons/electron. On the other hand injection of electrons from Al is very inefficient, particularly at low electric fields. At high injection currents (~1–2 A/cm$^2$) a saturation in the emission is observed due to possible failure of the device caused from the intense joule heating. The comparison between a ITO/PPV/Al and a ITO/DP-PPV/Al shows that DP-PPV is about 4 times more efficient than PPV.

EXAMPLE 7

This is another example of the halogen precursor route using 1,4-bis(chloromethyl)-2,3,5-triphenyl-benzene as the monomer, which is prepared via a similar reaction sequence shown in Scheme IV. The reaction set-up is the same as that described in examples 3 and 5. 1.0 M t-BuOK (2 ml, 0.002 mol in THF) is diluted by adding it through a syringe into the addition funnel precharged with THF (5 ml) and then added to a solution of the monomer (0.8 g, 0,003 mol) in THF (30 ml) with ice-water cooling. The resulting solution is stirred for 12 hours at room temperature and then poured into a stirred methanol (200 ml). The precipitate is collected by suction filtration and vacuum dried to give a white chlorine precursor pollymer (0.46 g, 63% ), which is soluble in typical organic solvents.

EXAMPLE 8

This is another example of the halogen precursor route using 1,4-bis(chloromethyl)-2,3-diphenyl-5-biphenyl-benzene as the monomer which is prepared according Scheme IV. 1.0 M t-BuOK (2.0 ml, 0.002 mol in THF, diluted with 5 ml THF) is added dropwise to an ice water cooled solution of the monomer (0.88 g, 0.0018 mol) in THF (30 ml). The resulting solution mixture is stirred for 12 hours at room temperature and then poured into a stirred methanol (200 ml). The precipitate is collected by suction filtration and air dried to give a white chlorine precursor polymer (0.66 g, 81%), which is soluble in typical organic solvents.

EXAMPLE 9

Another example of halogen precursor route is given here using 2,5-bis(chloromethyl)-3,4-diphenyl-thiophene as the monomer, which is prepared by chloromethylation of 3,4-diphenylthiophene using the procedure described in *The Journal of American Chemical society*, 115: 10117 (1993). 1.0 M t-BuOK (3.0 ml, 0.003 mol in THF) is added dropwise to a solution of the monomer (1.0 g, 0.003 mol) in THF. The resulting solution is stirred for one hour at room temperature and then poured into stirred methanol (150 ml). The precipitate is collected by suction filtration and air dried to give a light brown chlorine precursor polymer (0.50 g, 56% ). The chlorine precursor polymer undergoes gradual conversion to poly(3,4-diphenylthienylene vinylene) (DP-PTV) at room temperature; but is stable at −25° C. Unexpectedly, the polymer undergoes immediate conversion to DP-PTV in chloroform. Benzene also induces conversion at a moderate rate. The polymer is relatively stable in THF but also converts to DP-PTV after several days. THF is the only solvent found for the preparation of 1% precursor polymer solution for spin casting. Thin films of the precursor polymer are deposited on quartz substrates and then converted in the presence of chloroform vapor to DP-PTV which shows a broad absorption band ranging from 400 to 700 nm with a maximum at 546 nm. The thermal conversion at 150° C. for one hour gives DP-PTV with the identical absorption bands.

EXAMPLE 10

Another example of halogen precursor route is given here using a non-substituted monomer 1,4-bis(chloromethyl)benzene (available from Aldrich Chemical). 1.0 M t-BuOK (10.0 ml, 0.01 mol in THF) is quickly added to a solution of the monomer (1.75 g, 0.01 mol) in THF (50 ml). A yellow precipitate forms shortly thereafter. After stirring at room temperature for 1 hour, the reaction mixture is poured into methanol and the precipitate is collected by suction filtration, washed with methanol and air dried. The precipitate is not soluble in general organic solvents. This example shows that halogen precursor route should employ monomers containing solubilizing groups.

EXAMPLE 11

Another example of halogen precursor route is given here using another non-substituted monomer 1-chloromethyl-2-dichloromethyl benzene, which is prepared from p-tolualdehyde according to Scheme XIV. 1.0 M t-BuOK (5.0 ml, 0.005 mol in THF) is quickly added to a solution of the monomer (1.0 g, 0.005 mol) in THF (40 ml). A light yellow precipitate forms shortly thereafter. After stirring at room temperature for 1 hour, the reaction mixture is poured into methanol and the precipitate is collected by suction filtration, washed with methanol and air dried. The precipitate is found to be non-soluble in general organic solvents. This example further shows that halogen precursor route should employ monomers with solubilizing groups.

While the invention has been described with reference to particular preferred embodiments, it is understood that other embodiments and modifications can be made by those skilled in the art without departing from the spirit and scope of the present invention.

What is claimed is:

1. A method for making an electroluminescent device via halogen precursor route chemistry, the method comprising:

a) polymerizing at least one 1,4-bis(halomethyl)-benzene monomer in a first solvent by adding 1.0–1.5 equivalents of a base at −78° to 30° C. under an inert atmosphere;

b) stirring the reaction mixture for 1–24 hours at room temperature upon completion of base addition;

c) pouring the reaction mixture into a non-solvent to precipitate the resulting polymer;

d) collecting and drying the polymer in air or under vacuum to give a halogen precursor polymer;

e) preparing a dilute solution of the polymer by dissolving it in a second solvent;

f) depositing a film of the dissolved halogen precursor polymer onto a substrate;

g) dehydrohalogenating the halogen precursor polymer to convert it to a poly(arylene vinylene) film;

h) optionally depositing an electron transport layer on said film;

i) depositing cathodes on to the polymer film or electron transport layer to give an electroluminescent device comprising a poly(arylene vinylene) conjugated polymer.

2. The method of claim 1, wherein the base is selected from the group consisting of: metal alkoxides, metal hydrides, metal amides and metal triphenylmethanes.

3. The method of claim 1, wherein the first solvent is selected from the group consisting of t-butyl alcohol, ether, 1, 2-dimethoxyethane, benzene, tetrahydrofuran, toluene, liquid ammonia, and dimethylformamide.

4. The method of claim 1, wherein the conjugated polymer is selected from the group consisting of poly(phenylenevinylene), substituted derivatives of poly(phenylenevinylene) and poly(phenyleneacetylene).

5. The method of claim 1, wherein the film is deposited by spin-, draw- or gravure-coating.

6. The method of claim 1, wherein the film is of uniform thickness in the range 10 nm to 5 μm.

7. The method of claim 1, wherein an electron injecting layer is deposited on the polymer film or electron transport layer.

8. The method of claim 1, wherein said substrate is selected from the group consisting of glass, quartz, polyester, polycarbonate, polyacetate, polyacrylate, polymethacrylate and polysulfone.

9. The method of claim 1, wherein said catrode is selected from the group consisting of indium/tin oxides, platinum, nickel, palladium and graphite.

10. The method of claim 1, wherein the second solvent is selected from the group consisting of methylene chloride, chloroform, chlorobenzene, 1,2-dichloroethane, acetone, acetonitrile, ethyl acetate, methyl ethyl ketone, cyclohexanone, 1,1,2-trichloroethane, 2-dimethoxyethane, benzene, tetrahydrofuran, toluene, and butyl acetate.

11. The method of claim 1, wherein the dehydrohalogenating is accomplished at a temperature of about 100° C. to about 800° C.

12. The method of claim 1, wherein the dehydrohalogenating is performed in either a vacuum, an inert atmosphere or a reducing atmosphere.

13. The method of claim 1, wherein the non-solvent in step c) is a member selected from the group consisting of: methanol, acetone and hexane.

14. The method of claim 1, wherein the substrate in step f) is a conductive substrate.

* * * * *